United States Patent
Brioschi et al.

(10) Patent No.: US 10,225,635 B2
(45) Date of Patent: Mar. 5, 2019

(54) MICROELECTROMECHANICAL MICROPHONE

(71) Applicants: STMICROELECTRONICS S.R.L., Agrate Brianza (IT); STMICROELECTRONICS (MALTA) LTD, Kirkop (MT)

(72) Inventors: Roberto Brioschi, Sesto San Giovanni (IT); Alex Gritti, Vimercate (IT); Kevin Formosa, Zabbar (MT); Paul Anthony Barbara, Qawra (MT)

(73) Assignees: STMicroelectronics S.r.l., Agrate Brianza (IT); STMicroelectronics (Malta) Ltd, Kirkop (MT)

(*) Notice: Subject to any disclaimer, the term of this patent is extended or adjusted under 35 U.S.C. 154(b) by 55 days.

(21) Appl. No.: 15/143,207

(22) Filed: Apr. 29, 2016

(65) Prior Publication Data

US 2017/0006368 A1  Jan. 5, 2017

(30) Foreign Application Priority Data

Jun. 30, 2015 (IT) .................. 102015000029270
Sep. 30, 2015 (IT) .................. 102015000056964
Dec. 17, 2015 (IT) .................. 102015000084541

(51) Int. Cl.
  *H01L 27/14* (2006.01)
  *H04R 1/04* (2006.01)
  (Continued)

(52) U.S. Cl.
  CPC .............. *H04R 1/04* (2013.01); *B81B 7/008* (2013.01); *B81B 7/0061* (2013.01); *H04R 19/005* (2013.01); *H04R 19/04* (2013.01); *H04R 31/006* (2013.01); *B81B 2201/0257* (2013.01); *B81B 2203/0127* (2013.01); *B81B 2207/012* (2013.01); *B81B 2207/07* (2013.01); *H04R 1/06* (2013.01); *H04R 31/00* (2013.01); *H04R 2201/003* (2013.01); *H04R 2499/11* (2013.01)

(58) Field of Classification Search
  CPC ... B81B 7/02; B81B 2201/0257; B81B 7/008; B81B 2207/012
  USPC .................. 257/414, 686, 777, 723, 724
  See application file for complete search history.

(56) References Cited

U.S. PATENT DOCUMENTS 7,563,652 B2 * 7/2009 Yang ..................... H01L 21/568
                                                           257/434
9,137,903 B2 * 9/2015 Kang .................... H01L 23/562
(Continued)

FOREIGN PATENT DOCUMENTS

CN  101425495 A  5/2009
CN  202425043 U  9/2012
(Continued)

*Primary Examiner* — S. V. Clark
(74) *Attorney, Agent, or Firm* — Seed Intellectual Property Law Group LLP

(57) ABSTRACT

A microelectromechanical microphone includes: a substrate; a sensor chip, integrating a microelectromechanical electroacoustic transducer; and a control chip operatively coupled to the sensor chip. In one embodiment, the sensor chip and the control chip are bonded to the substrate, and the sensor chip overlies, or at least partially overlies, the control chip. In another embodiment, the sensor is bonded to the substrate and a barrier is located around at least a portion of the sensor chip.

23 Claims, 20 Drawing Sheets

(51) Int. Cl.
B81B 7/00 (2006.01)
H04R 19/00 (2006.01)
H04R 19/04 (2006.01)
H04R 1/06 (2006.01)
H04R 31/00 (2006.01)

(56) References Cited

U.S. PATENT DOCUMENTS

| | | |
|---|---|---|
| 2005/0189622 A1 | 9/2005 | Humpston et al. |
| 2008/0197512 A1 | 8/2008 | Marchi et al. |
| 2011/0150261 A1 | 6/2011 | Ho et al. |
| 2013/0070951 A1* | 3/2013 | Tanaka .................... H04R 1/38 381/361 |
| 2013/0193533 A1 | 8/2013 | Vos et al. |
| 2013/0195284 A1 | 8/2013 | Yang et al. |
| 2013/0322662 A1 | 12/2013 | Chen et al. |
| 2014/0015069 A1 | 1/2014 | Liang et al. |
| 2014/0042565 A1 | 2/2014 | Fuergut et al. |
| 2015/0264463 A1* | 9/2015 | Kuzuyama ........... H04R 19/005 381/174 |
| 2016/0099210 A1* | 4/2016 | Kwon ............... H01L 21/76829 257/774 |
| 2016/0117015 A1 | 4/2016 | Veneri et al. |

FOREIGN PATENT DOCUMENTS

| | | |
|---|---|---|
| CN | 203774310 U | 8/2014 |
| DE | 10 2011 007 604 A1 | 10/2012 |
| EP | 1 788 624 A1 | 5/2007 |
| TW | 200513131 A | 4/2005 |
| WO | 2012143151 A1 | 10/2012 |

* cited by examiner

MICROELECTROMECHANICAL MICROPHONE

BACKGROUND

Technical Field

The present disclosure relates to microelectromechanical microphones and to processes for manufacturing microelectromechanical microphones.

Description of the Related Art

Microelectromechanical microphones are known, which comprise a first chip incorporating a microelectromechanical electroacoustic membrane transducer, and a second chip incorporating a control circuit or ASIC (Application-Specific Integrated Circuit). The electroacoustic transducer converts incident acoustic waves, which cause vibrations of a membrane, into electrical signals. For example, the membrane may be capacitively coupled to a reference electrode. The deformations of the membrane modify the capacitive coupling, which may be easily detected with a charge-amplifier circuit of the control circuit. The control circuit comprises signal-processing stages (for example, the charge-amplifier circuit) and components suitable for interacting with and enabling operation of the microelectromechanical microphone, in particular transduction of the acoustic signals.

The first chip and the second chip are housed within a same package structure for electronic devices, which generally includes a supporting substrate and a cap of plastic or metal material.

The substrate may be a polymeric or ceramic substrate, for example of the LGA (Land-Grid Array) type and is provided with connection structures (pads and lines) for electrical connection of the first chip and of the second chip, which are arranged alongside one another. Further, the substrate has an opening, also referred to as "sound port", which enables transmission of the acoustic signals from outside of the package structure to the transducer that is inside the package structure.

The cap is bonded to the substrate and may have a dual function of protection and definition of an acoustic chamber and, for this reason, may have a determining effect upon the performance of the microelectromechanical microphone.

The attention directed to the development and integration of microelectromechanical sensors has been progressively increasing, in step with the spread of portable electronic devices such as smartphones and tablets or other electronic devices of the so-called "wearable" type. The at times tumultuous development of products of this kind may, in some cases, set down specifications that are contrasting or difficult to reconcile. On the one hand, for example, there is the desire to offer microelectromechanical transducers with increasingly higher levels of performance to meet the specifications of users. This generally leads to providing chips of larger dimensions both for the microelectromechanical transducer and for the control circuit. On the other hand, instead, there is the contrasting desire to reduce more and more the dimensions of microelectromechanical microphones, especially in portable and wearable systems.

Additionally, fitting two chips, such as a control ASIC and a microelectromechanical transducers in the package can be difficult. The size of the chip incorporating the control ASIC is often reduced for allowing greater space for the chip incorporating the transducer. However, there is a desirable to increase the size of the chip incorporating the ASIC to make available a larger number of functions for control and processing of the transduced signals.

BRIEF SUMMARY

One or more embodiments of the present disclosure provide a microelectromechanical microphone that may overcome or at least attenuate one or more of the limitations described above.

Various aspects of the present disclosure are directed to microelectromechanical microphones and methods of making same in accordance with various embodiments. For instance, in one embodiment is directed to a microelectromechanical microphone comprising a substrate; a sensor chip bonded to the substrate and integrating a microelectromechanical acoustic transducer; and a control chip bonded to the substrate and operatively coupled to the sensor chip, the sensor chip having a first portion that is overlying and bonded to the control chip.

In one embodiment the control chip has a first face, wherein the first portion of the sensor chip is bonded to the first face of the control chip, wherein the acoustic transducer includes a transduction member acoustically communicating with a sound port in the substrate.

In one embodiment the substrate includes an assembly base, and the sensor chip has a second portion coupled to the base.

In one embodiment the microelectromechanical microphone comprises an adhesive layer that is partially on the base and partially on the first face of the control chip along a perimeter of the sensor chip, the sensor chip being bonded to the base and to the control chip through the adhesive layer.

In one embodiment the base has a first thickness and the control chip has a second thickness that is substantially the same thickness as the first thickness.

In one embodiment the base extends around the sound port.

In one embodiment the substrate includes a core of a rigid dielectric material, and a metal layer on a face of the core, the sensor chip and the control chip being bonded to the metal layer.

In one embodiment the control chip is fixed to the core of the substrate and has a face substantially flush with an assembly surface of the base.

In one embodiment the metal layer of the substrate defines a supporting portion; a solder mask is fixed to the supporting portion; and the solder mask and the supporting portion of the metal layer form the base.

In one embodiment the microelectromechanical microphone comprises a housing that houses the control chip, the housing being defined on one side by the core of the substrate.

In one embodiment the housing is adjacent to the base.

In one embodiment the base is arranged adjacent to the sound port and has a first thickness, the control chip having a second thickness that is substantially equal to the first thickness.

In one embodiment the transduction member is centered around the sound port.

In one embodiment the transduction member comprises a membrane of semiconductor material extending over a cavity in a body of the sensor chip, the cavity being delimited on one side by the transduction member and being open on an opposite side.

In one embodiment the cavity is acoustically coupled to the sound port.

In one embodiment the microelectromechanical microphone comprises a cap bonded to the substrate and forming, with the cap, an acoustic chamber acoustically coupled with an environment outside of the microphone through the sound port, the acoustic chamber housing the control chip and the sensor chip.

Another embodiment is directed to an electronic system comprising a control unit and a microelectromechanical microphone operatively coupled to the control unit. The microelectromechanical microphone includes a substrate having an inner surface and an outer surface; a control chip coupled to the inner surface of the substrate; and a sensor chip having a first surface portion coupled to the substrate and a second surface portion coupled to the control chip, the first and second surfaces being coplanar, the sensor chip integrating a microelectromechanical acoustic transducer.

The electronic system may be one of at least one of a cellphone, a portable computer, a video camera, a photographic camera, a multimedia reader, a motion-activated user interface, a satellite-navigation device, and a wearable device.

The electronic system may further comprise a base coupled to the substrate and the sensor chip.

Another embodiment is directed to microelectromechanical microphone comprising a package body including a first substrate and a cap coupled to the substrate and forming an inner cavity, the first substrate having an inner surface and an outer surface and a through hole extending from the inner surface to outer surface. The microelectromechanical microphone comprises a control chip in the inner cavity and coupled to the inner surface of the substrate; a second substrate coupled to the inner surface of the substrate; and a sensor chip having a first portion coupled directly to the second substrate and a second portion coupled directly to the control chip, the sensor chip including a membrane facing the through hole of the second substrate.

In one embodiment a surface of the second substrate and a surface of the control chip are substantially coplanar, and wherein the first portion of the sensor chip is coupled to the surface of the second substrate and the second portion of the sensor chip is coupled to the surface of the control chip.

In one embodiment the second substrate is a C-shaped and located around the through opening.

In one embodiment the second substrate is made of a material that is one of a metal, glass, or silicon.

Various other aspects of the present disclosure are directed to microelectromechanical microphones and methods of making same in accordance with other embodiments.

For instance, one embodiment is directed to a microelectromechanical microphone comprising a supporting substrate having a first face and a second face; a sensor chip bonded to the first face of the supporting substrate and integrating an microelectromechanical electroacoustic transducer; and a control chip having at least one portion between the first face and the second face of the supporting substrate and operatively coupled to the sensor chip, the sensor chip being at least partially arranged on top of the control chip.

In one embodiment the supporting substrate has a through hole between the first face and the second face, and the control chip is housed at least partially in the through hole.

In one embodiment the microelectromechanical microphone comprises a fixing structure laterally surrounding the control chip, wherein the control chip is coupled to the supporting substrate by the fixing structure.

In one embodiment the control chip has a face that is coplanar with the second face of the supporting substrate.

In one embodiment the control chip has a first thickness and the supporting substrate has a second thickness, the second thickness being substantially equal to first thickness.

In one embodiment the first thickness is greater than the second thickness and the face of the control chip projects beyond the through hole and the first face of the supporting substrate.

In one embodiment the control chip has a projecting portion and a recess that receives a portion of the sensor chip.

In one embodiment the recess is delimited by a base that is coplanar with the first face of the supporting substrate, wherein the recess is delimited by a wall substantially perpendicular to the base, the projecting portion of the control chip forming a step with respect to the base of the recess.

In one embodiment a portion of the sensor chip has a recess that houses an edge of the control chip.

In one embodiment the control chip has a first thickness and the supporting substrate has a second thickness, the first thickness being smaller than the second thickness, and wherein the fixing structure is cup-shaped.

In one embodiment a first face of the control chip is aligned with the first face of the supporting substrate, and a bottom portion of the fixing structure is aligned to the second face of the supporting substrate.

In one embodiment the substrate includes a mounting base, and the sensor chip has a first portion fixed to the control chip and a second portion fixed to the base.

In one embodiment the substrate includes a rigid dielectric material, and a metal layer on the rigid dielectric material, the sensor chip and the control chip being fixed to the rigid dielectric material.

In one embodiment the metal layer defines a supporting portion; a solder mask is fixed to the supporting portion; and the solder mask and the supporting portion of the metal layer form the base.

In one embodiment the supporting substrate is defined by the control chip.

In one embodiment the microelectromechanical microphone comprises a cap bonded to the supporting substrate, the cap forming, along with the supporting substrate, an acoustic chamber, the sensor chip located in the acoustic chamber and acoustically coupled with an external environment through a sound port.

In one embodiment the sound port is in the supporting substrate.

In one embodiment the sound port is in the control chip.

In one embodiment a first portion of the sound port is defined in the supporting substrate and a second portion of the sound port is defined in the control chip.

In one embodiment the sensor chip is centered around the sound port.

In one embodiment the sensor chip includes a transduction member acoustically communicating with the outside through the sound port.

In one embodiment the transduction member includes a membrane of semiconductor material over a cavity in the sensor chip, the cavity being delimited on a first side by the transduction member and acoustically coupled to the sound port.

Another embodiment is directed to an electronic system comprising a control unit; and a microelectromechanical microphone operatively coupled to the control unit. The microelectromechanical microphone includes a supporting substrate having a first face and a second face; a sensor chip bonded to the first face of the supporting substrate and integrating an microelectromechanical electroacoustic transducer; and a control chip having at least one portion between the first face and the second face of the supporting substrate and operatively coupled to the sensor chip, the sensor chip being at least partially arranged on top of the control chip.

The electronic system may be one of at least one of a cellphone, a portable computer, a video camera, a photographic camera, a multimedia reader, a motion-activated user interface, a satellite-navigation device, and a wearable device.

Another embodiment is directed to a process for manufacturing a microelectromechanical microphone comprising applying an adhesive-tape support to one of a first face and a second face of a supporting substrate, the adhesive-tape support covering a through hole that extends through the supporting substrate from the first face to the second face; placing a control chip in the through opening; bonding the control chip to the adhesive-tape support; and filling a space between walls of the through hole and the control chip with a polymeric material in a molding operation.

In one embodiment the process comprises bonding a sensor chip to the first face of the supporting substrate, the sensor chip including an electroacoustic transducer.

In one embodiment the control chip has a first thickness and the supporting substrate has a second thickness that is less than first thickness, wherein the adhesive-tape support is applied to the second face of the supporting substrate.

In one embodiment the control chip has a first thickness and the supporting substrate has a second thickness that is less than the first thickness, wherein the adhesive-tape support is applied to the first face of the supporting substrate.

In one embodiment the process comprises removing the adhesive-tape support after filling the space.

Various other aspects of the present disclosure are directed to microelectromechanical microphones and methods of making same in accordance with yet other embodiments.

For instance, one embodiment is directed to a microelectromechanical microphone comprising a substrate having an inner surface and an outer surface; a sensor chip having a first face and second face, the first face of the sensor chip coupled to the inner surface of substrate, the second face of the sensor chip integrating a MEMS electroacoustic transducer; a control chip coupled to the substrate and operatively coupled to the sensor chip; a bonding ring surrounding the sensor chip and the control chip; a cap coupled to the substrate by the bonding ring and forming an acoustic chamber with the substrate, the control chip and the sensor chip located in the acoustic chamber; and a barrier between the bonding ring and the sensor chip, the barrier being located a first distance from the bonding ring and defining a first trench, the barrier being located a second distance from the sensor chip and defining a second trench.

In one embodiment the sensor chip is shaped to have one or more rounded corners or chamfered corners.

In one embodiment the corners are chamfered on one side of the sensor chip, the side of the sensor chip that is chamfered includes the second face of the sensor chip.

In one embodiment at the one or more rounded corners the barrier forms curvilinear paths having a first radius of curvature, and wherein the one or more rounded corners have a second radius of curvature equal to the first radius of curvature.

In one embodiment the sensor chip has side walls extending between the first face and the second face, the sensor chip being coupled to the substrate at the second face and having a perimetral recess that extends along bottom portions of the side walls so that the area of the first face is 10%-25% greater than the area of the second face.

In one embodiment the perimetral recess extends, starting from the second face, towards the first face up to a height that is greater than a height of the barrier.

In one embodiment the microelectromechanical microphone comprises a glue layer, wherein the sensor chip is coupled to the substrate by the glue layer, the second trench forming a region of accumulation for excess glue that flows out of the glue layer.

In one embodiment the microelectromechanical microphone comprises a solder paste layer wherein the cap is coupled to the bonding ring by the solder paste layer, the first trench forming a region of accumulation for excess solder paste that flows out of the solder-paste layer.

In one embodiment the barrier has a height that is between 15 μm and 25 μm.

In one embodiment the sensor chip includes a transduction member in acoustic communication with a sound port in the substrate.

In one embodiment the substrate includes a dielectric material and a metal layer on a face of the dielectric material, the sensor chip and the control chip being coupled to the dielectric material, and the first and second trenches extending in the metal layer.

In one embodiment the microelectromechanical microphone comprises a solder mask, wherein the control chip is fixed to the dielectric material of the substrate by the solder mask.

Another embodiment is directed to an electronic system comprising a control unit; and a microelectromechanical microphone operatively coupled to the control unit. The microelectromechanical microphone includes a substrate having an inner surface and an outer surface; a sensor chip having a first face and second face, the first face of the sensor chip coupled to the inner surface of substrate, the second face of the sensor chip integrating a MEMS electroacoustic transducer; a control chip coupled to the substrate and operatively coupled to the sensor chip; a bonding ring surrounding the sensor chip and the control chip; a cap coupled to the substrate by the bonding ring and forming an acoustic chamber with the substrate, the control chip and the sensor chip located in the acoustic chamber; and a barrier between the bonding ring and the sensor chip, the barrier being located a first distance from the bonding ring and defining a first trench, the barrier being located a second distance from the sensor chip and defining a second trench.

The electronic system may be one of at least one of a cellphone, a portable computer, a video camera, a photographic camera, a multimedia reader, a motion-activated user interface, a satellite-navigation device, and a wearable device.

Another embodiment is directed to a process for manufacturing a microelectromechanical microphone. The process includes bonding a sensor chip integrating a microelectromechanical electroacoustic transducer to a first surface of a substrate; mechanically coupling a control chip to the first surface of the substrate and operatively coupling the control chip to the sensor chip; forming a barrier on the first surface of the substrate; coupling a cap to the substrate by a bonding ring around the sensor chip and the control chip, the cap and the substrate forming an acoustic chamber, the control chip and the sensor chip being located in the acoustic chamber; and wherein the barrier is between the bonding ring and the sensor chip, the barrier being at a first distance from the bonding ring to form a first trench and at a second distance from the sensor chip to form a second.

In one embodiment the sensor chip has a polygonal shape with sharp corners.

In one embodiment the process comprises shaping at least one of the sharp corners by forming rounded corners or chamfered corners.

In one embodiment the sensor chip has a first face, a second face, and side walls that extend between the first face and the second face, the sensor chip being coupled to the substrate by the first face, the process further comprising removing portions of the side walls of the sensor chip and including the side walls at the first face but not including the side walls at the second face to form a perimetral recess such that the area of the second face is 10%-25% greater than the area of the first face.

In one embodiment the area of the second face is 15% greater than the area of the first face.

BRIEF DESCRIPTION OF THE SEVERAL VIEWS OF THE DRAWINGS

For a better understanding of the disclosure, some embodiments thereof will now be described, purely by way of non-limiting example and with reference to the attached drawings, in which.

DETAILED DESCRIPTION

Figure 1:
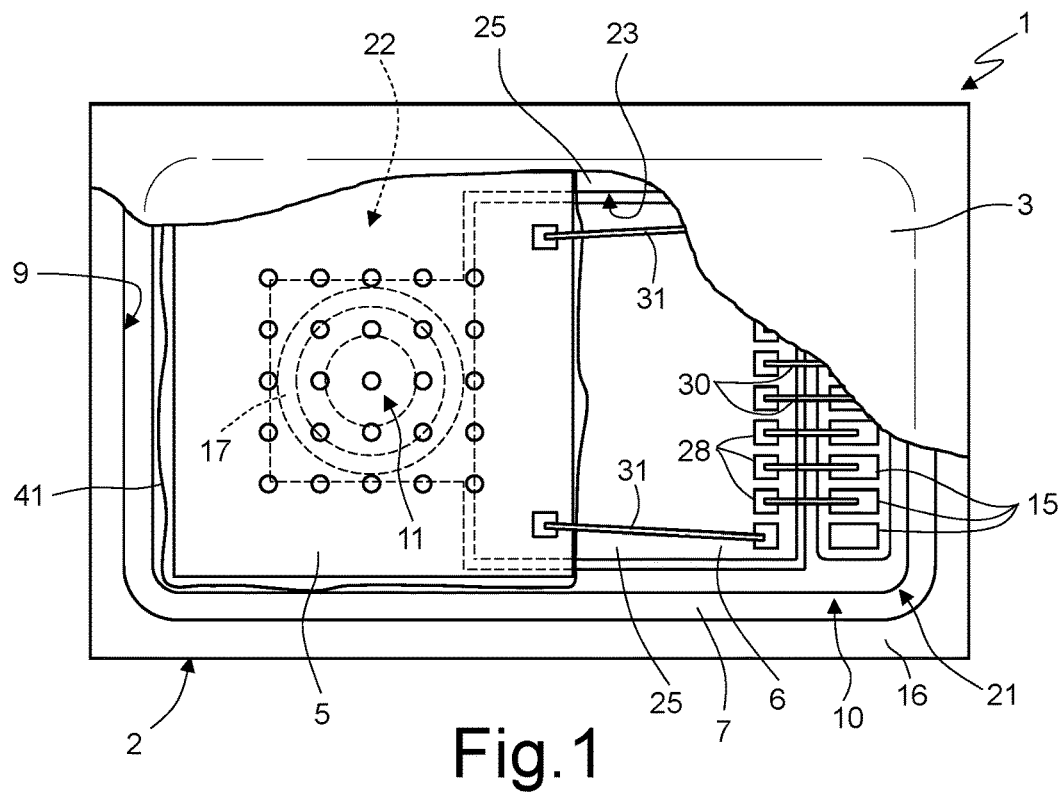
FIG. 1 is a top plan view, partially sectioned along a longitudinal plane, of a microelectromechanical microphone according to one embodiment of the present disclosure.
Figure 2:
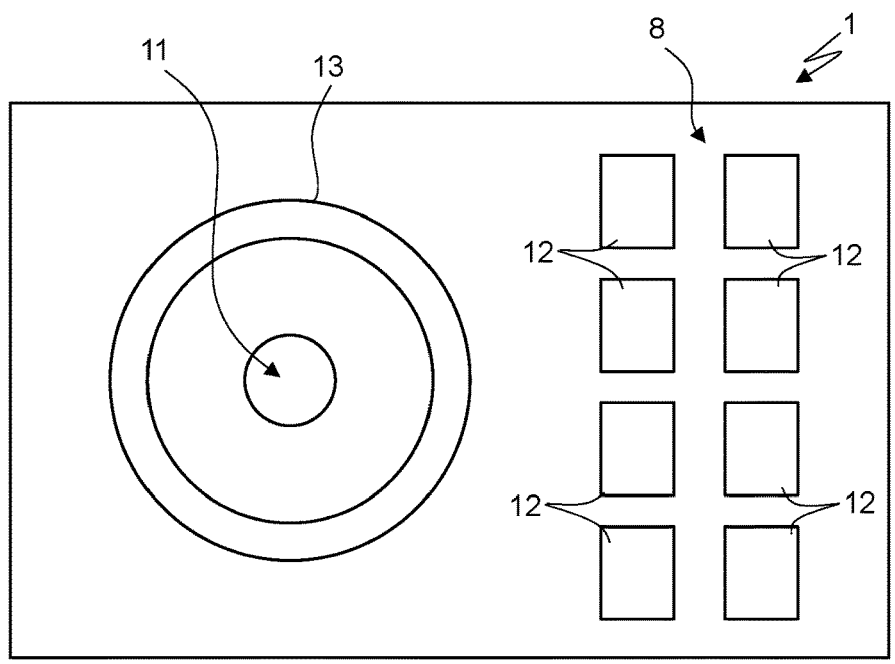
FIG. 2 is a plan view from beneath of the microelectromechanical microphone of FIG. 1.

Features described herein that have same reference numbers have the same structure and function and thus may not be described again in the interest of brevity.

With reference to FIGS. 1 to 4, a microelectromechanical microphone according to one embodiment of the present disclosure is designated as a whole by the reference number 1 and comprises a substrate 2, a cap 3, a sensor chip 5, and a control chip 6. The sensor chip 5 and the control chip 6 are operatively coupled together.

The substrate 2 and the cap 3 are bonded together (FIG. 3) and form a package structure, inside which the sensor chip 5 and the control chip 6 are housed. The cap 3 has a protective function and also defines an acoustic chamber 4 of the microelectromechanical microphone 1.

In one embodiment, the substrate 2 may be a substrate of an LGA type and comprises: a core 7; an external metal layer 8 and an internal metal layer 9, for example of copper, on opposite faces of the core 7; and a solder mask 10. A through hole in the substrate 2 defines a sound port 11 and enables acoustic coupling of the inside of the package structure, in particular of the sensor chip 5, with the external environment.

The core 7 (FIGS. 3 and 4) is defined by a chip of rigid dielectric material, for example FR4, having a major, longitudinal, dimension and a minor, transverse, dimension.

The external metal layer 8 (FIG. 2) is arranged on an outer face of the core 7, i.e., opposite to the cap 3. Defined in the external metal layer 8 are first features, amongst which, in particular, external contacts 12 for electrical connection of the microelectromechanical microphone 1 and an external guard ring 13 around the sound port 11. The external guard ring 13 may be used also for connection to ground and is thus also referred to as a "ground ring".

The internal metal layer 9 (FIGS. 1, 3, and 4) is arranged on an inner face of the core 7, closed by the cap 3. Defined in the internal metal layer 9 are second features, amongst which internal contacts 15, a bonding ring 16, along the perimeter of the core 7, an internal guard ring 17 around the sound port 11, and a supporting portion 18.

The cap 3 is fixed to the bonding ring 16.

The internal contacts 15 are electrically coupled to respective external contacts 12 with through vias 20 in the core 7. In one embodiment, the internal contacts 15 are aligned and are arranged at one end of the substrate 2 longitudinally opposite with respect to the sound port 11.

The solder mask 10 is bonded to the supporting portion 18 of the internal metal layer 9. In one embodiment, the solder mask 10 and the supporting portion 18 are shaped so as to present, in plan view, a same profile and together define a contact island 21, around the internal contacts 15, an assembly base 22 around the sound port 11, and a housing 24 between the base 22 and the contact island 21.

The contact island 21 surrounds the internal contacts 15, separating them laterally from the rest of the conductive structures on the substrate 2.

The base 22 functions as anchorage for the sensor chip 5. For this purpose, the base 22 extends over an area sufficient for supporting the sensor chip 5 in a stable way astride of the sound port 11. In one embodiment, the base 22 is substantially C-shaped and extends around the sound port 11 along three sides of the substrate 2.

The housing 24 is defined by a recess delimited on one side by the base 22 and on an opposite side by the contact island 21. The housing 24 may further be delimited on the sides by perimetral walls 25, which join the contact island 21 to the base 22. On the bottom, the housing 24 is delimited by the core 7. The depth of the housing 24 is substantially equal to the height of the internal metal layer 9 and of the solder mask 10.

The control chip 6 houses an integrated control circuit or ASIC (not shown in detail), which comprises signal-processing stages (for example, a charge-amplifier circuit for a capacitive electroacoustic sensor) and the components suitable for interacting with and enabling operation of the microphone, in particular as regards to transduction of the acoustic signals. The control chip 6 is arranged within the housing 24, without obstructing the sound port 11. In greater detail, a face of the control chip 6 is bonded to the core 7 of the substrate 2 by an adhesive layer 26. The adhesive layer 26 may, for example, be a layer of glue dispensed on the core 7 of the substrate 2 within the housing 24 or else an adhesive tape. On an opposite face, the control chip 6 has contact pads 28 for connection to the internal contacts 15 by first wire bondings 30 and to the sensor chip 5 by second wire bondings 31.

The control chip 6 and the adhesive layer 26 have an overall thickness substantially equal to the depth of the housing 24 in such a way that the control chip 6 does not project in a significant way with respect to the height of the solder mask 10. Possibly, the control chip 6 may undergo mechanical or chemical-mechanical surface machining, such as chemical mechanical polishing (CMP), in order to adapt the thickness to the depth of the housing 24. A face 6a of the control chip 6 is thus substantially flush with an assembly surface 22a of the base 22, i.e., in practice, with the surface of the solder mask 10 opposite to the internal metal layer 9. However, also the case where the face 6a of the control chip 6 is arranged in or projects slightly may be tolerated without specifying for particular arrangements in order to compensate for the misalignment.

An electroacoustic transducer 35 is integrated in the sensor chip 5 and, in one embodiment, comprises a membrane 37 of semiconductor material, extending over a cavity 38 formed in the body 5a of the sensor chip 5, and a rigid metal backplate 40, capacitively coupled to the membrane 37. The backplate 40 is provided with holes and is arranged alongside the membrane 37 on the side opposite to the cavity 38. The cavity 38 is delimited on one side by the membrane 37 and is open on the opposite side.

The sensor chip 5 is bonded to the substrate 2 in such a way that the membrane 37 is in acoustic communication with the outside of the package structure formed by the substrate 2 and by the cap 3 through the sound port 11. In one embodiment, the sensor chip 5 is centered around the sound port 11.

Further, the sensor chip 5 is in part arranged longitudinally on top of the control chip 6, which, as already mentioned, is substantially flush with the solder mask 10. In greater detail, the sensor chip 5 has a first portion fixed to the face 6a of the control chip 6 and a second portion fixed to the base 22 around the sound port 11. Fixing is obtained by an adhesive layer 41, for example a glue or a soldering paste, which extends in part on the base 22 and in part on the face 6a of the control chip 6, along the perimeter of the sensor chip 5.

Given the same dimensions, setting the sensor chip 5 and the control chip 6 on top of one another, with the control chip 6 located in the housing 24 and the sensor chip 5 fixed in part to the base 22, enables reduction of the overall area occupied, without increasing the total thickness of the microelectromechanical microphone 1. Vice versa, given the same area occupied, the sensor chip 5 and the control chip 6 may have larger dimensions, to the advantage of performance.

Figure 6:
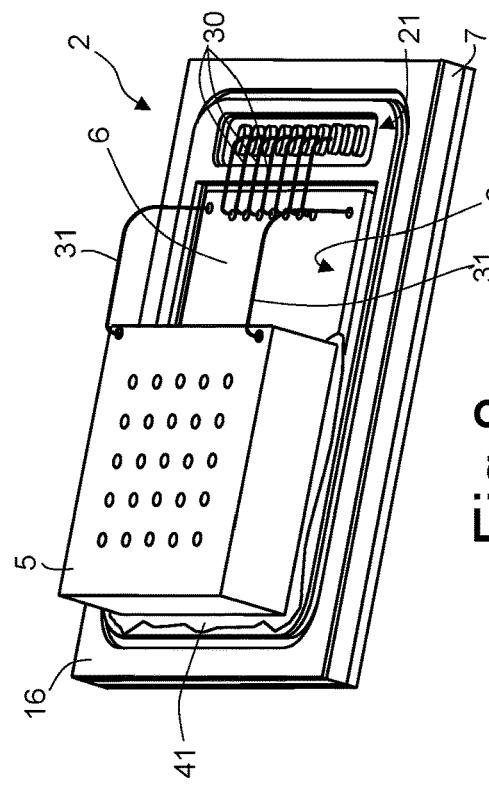
Figure 7:
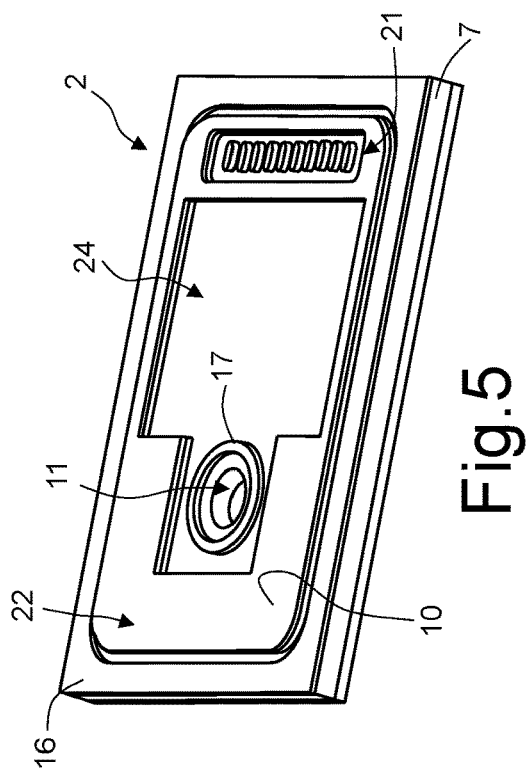
Figure 8:
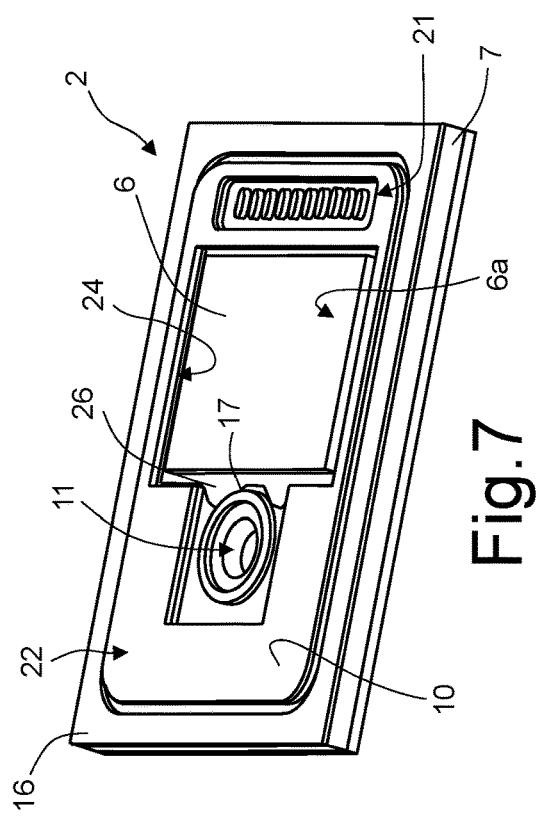

Assembly of the microelectromechanical microphone 1 may be carried out in the way described in what follows with reference to FIGS. 5 to 8. Initially, the external metal layer 8, the internal metal layer 9, and the solder mask 10 are defined with photolithographic processes to obtain the external contacts 12, the internal contacts 15, the bonding ring 16, and the base 22 (FIG. 5) using standard techniques. The adhesive layer 26 is dispensed or arranged (according to the type of adhesive used) on the bottom of the housing 24 (FIG. 6). The control chip 6 is bonded to the substrate 2 by the adhesive layer 26 (FIG. 7). The adhesive layer 41 is laid on the base 22 and on part of the face 6a of the control chip 6, and the sensor chip 5 is bonded to the substrate 2 and to the control chip 6 by the adhesive layer 41 (FIG. 8). The wire bondings 30 are formed between the control chip 6 and the internal electrodes 15, the wire bondings 31 are formed between the control chip 6 and the sensor chip 5, and the cap 3 is bonded to the bonding ring 16 of the substrate 2, thus obtaining the structure of FIG. 1.

Figure 9:
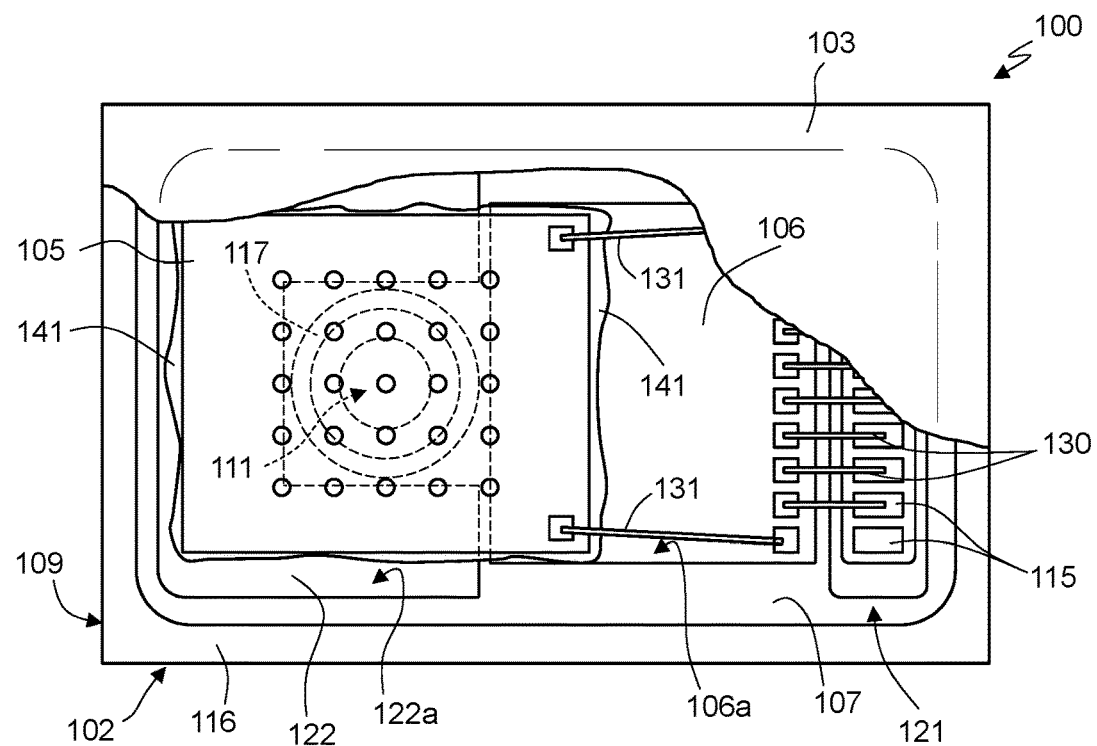
FIG. 9 is a top plan view, partially sectioned along a longitudinal plane, of a microelectromechanical microphone according to a different embodiment of the present disclosure.
Figure 10:
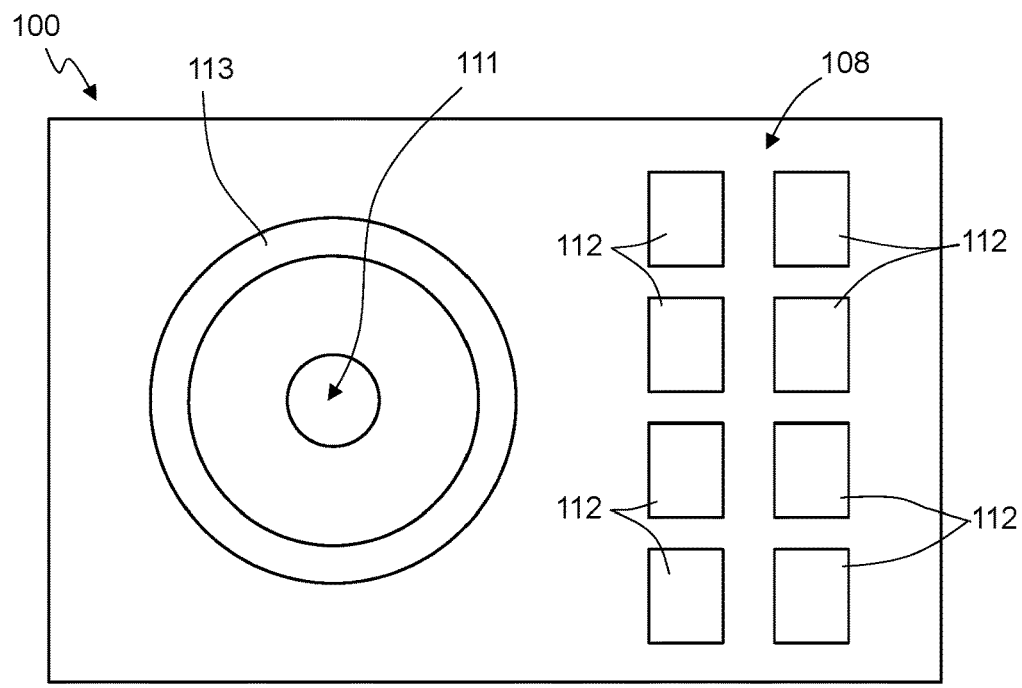
FIG. 10 is a plan view from beneath of the microelectromechanical microphone of FIG. 9.
Figure 11:
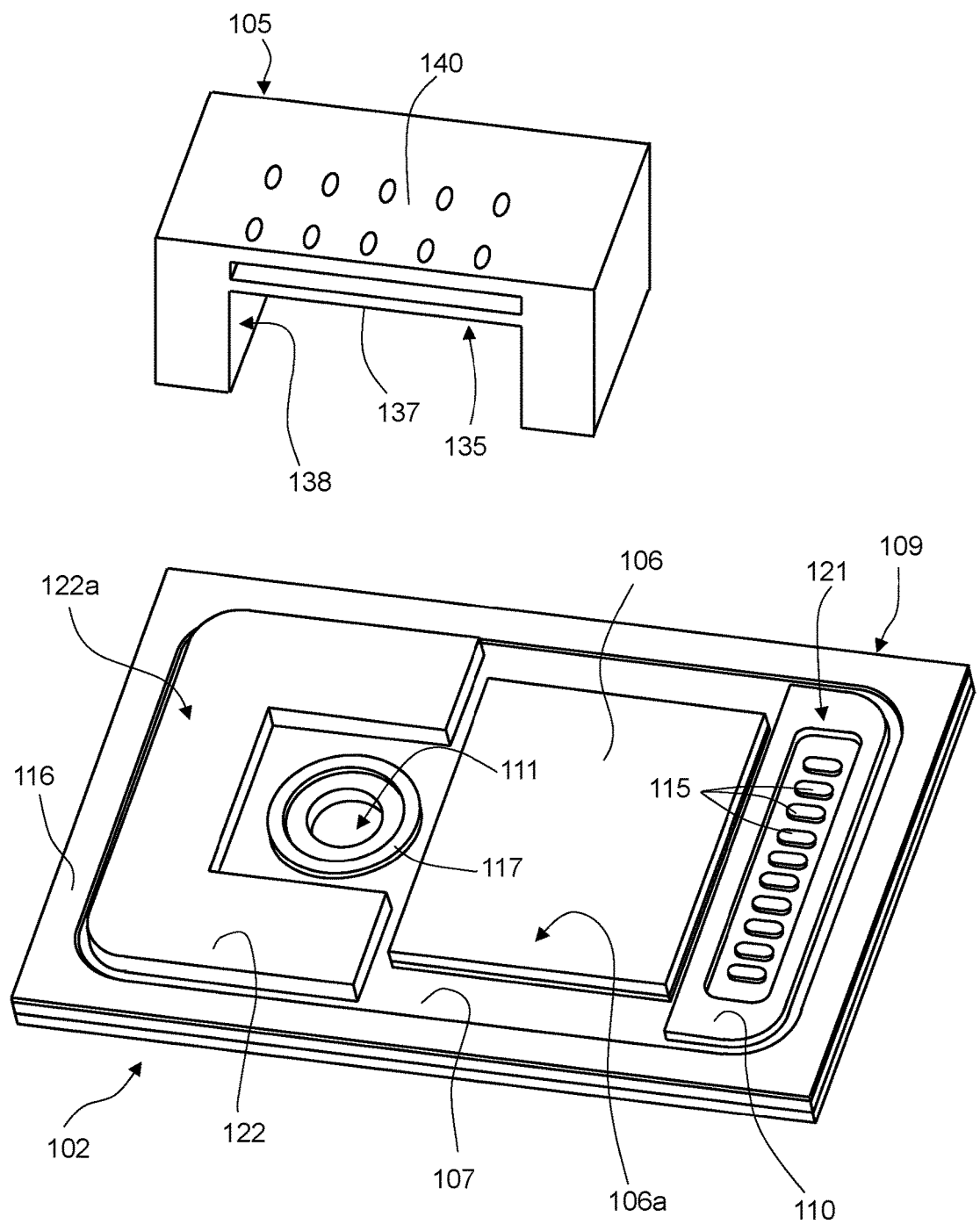
FIG. 11 is a perspective view of the microelectromechanical microphone of FIG. 5, partially sectioned along the line XI-XI of FIG. 9 and with parts removed for clarity.
Figure 12:
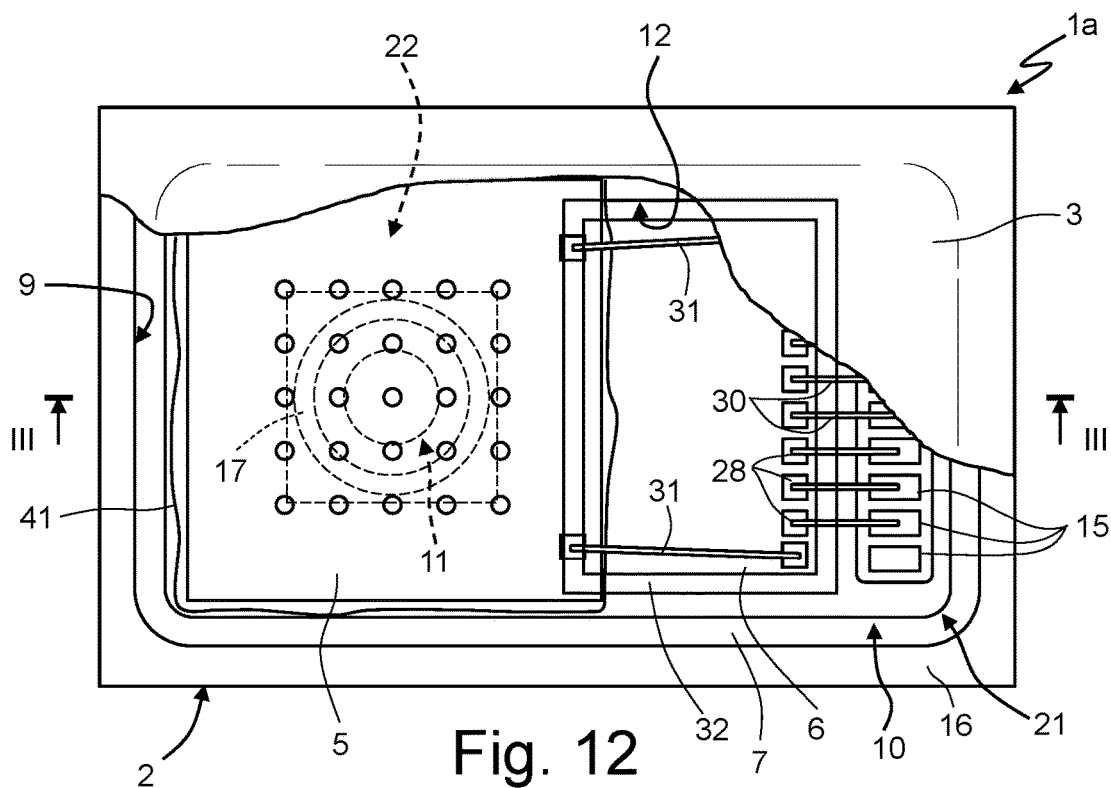
FIG. 12 is a partially sectioned top plan view of a microelectromechanical microphone according to another embodiment.
Figure 13:
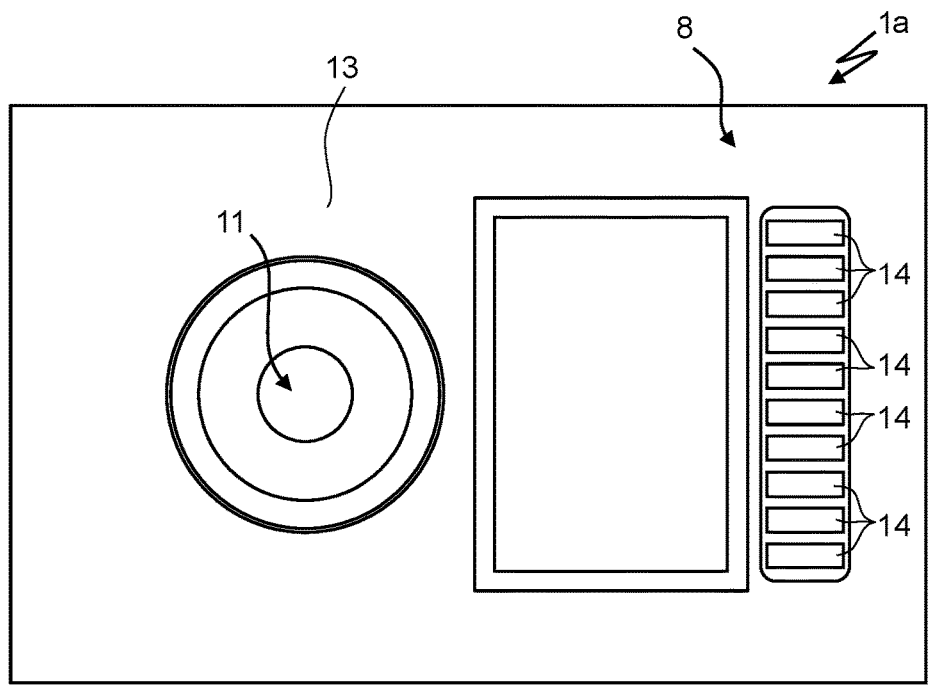
FIG. 13 is a plan view from beneath of the microelectromechanical microphone of FIG. 12.
Figure 14:
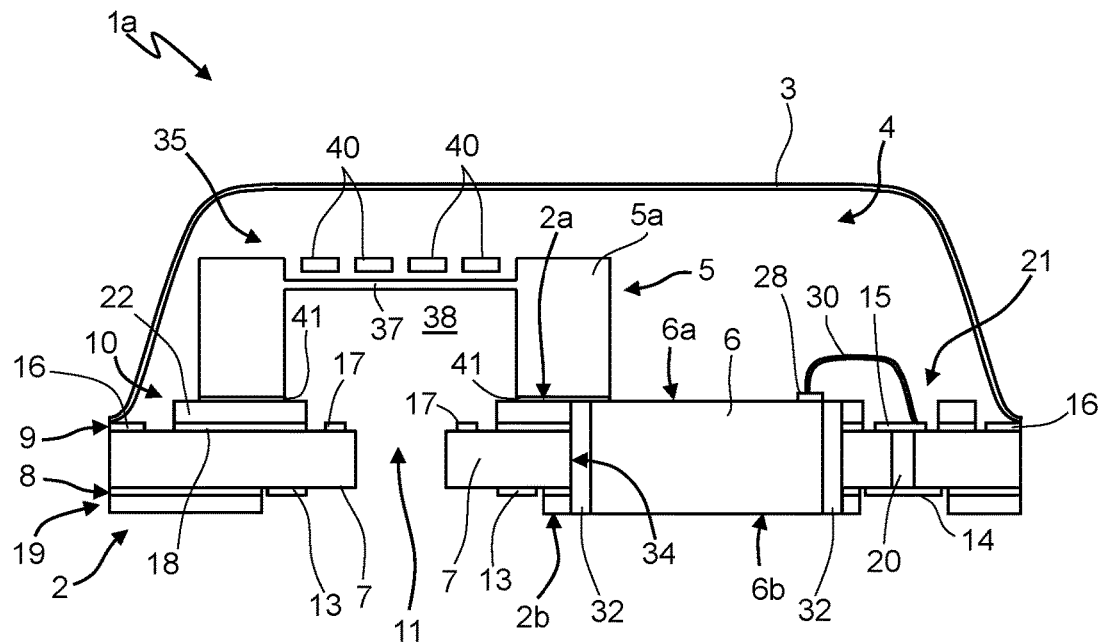
FIG. 14 is a side view of the microelectromechanical microphone of FIG. 12, sectioned along the line III-III of FIG. 12.
Figure 15:
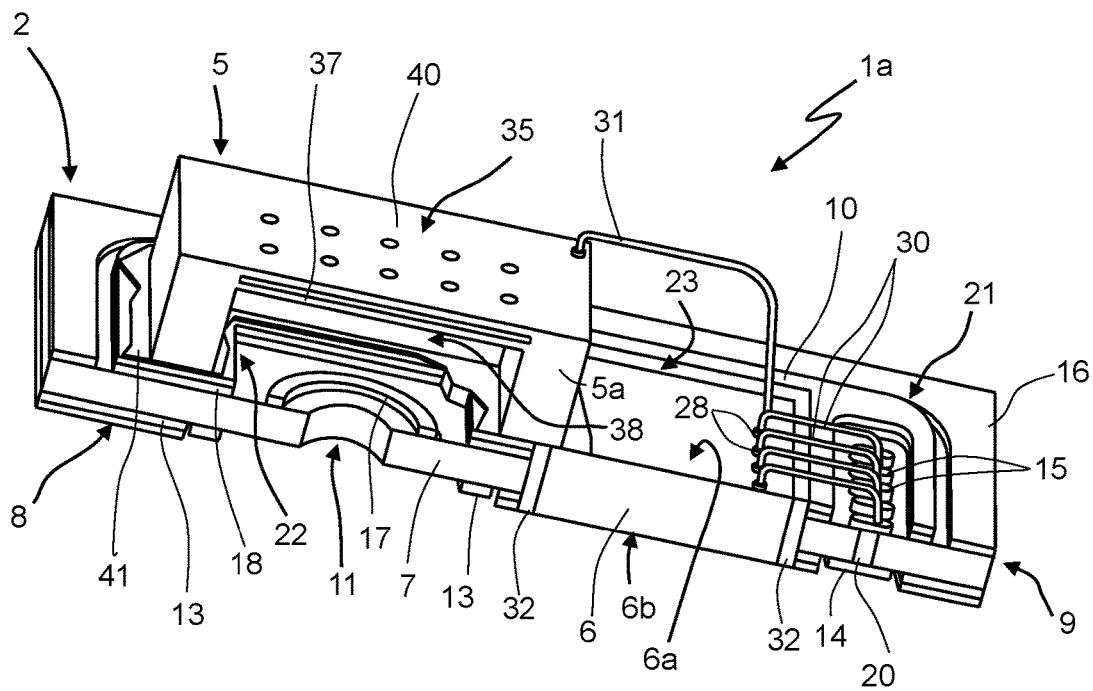
FIG. 15 is a perspective view of the microelectromechanical microphone of FIG. 12, sectioned along the line III-III of FIG. 12 and with parts removed for clarity.

A different embodiment of the disclosure is illustrated in FIGS. 9 to 11. In this case, a microelectromechanical microphone 100 comprises a substrate 102, a cap 103, a sensor chip 105, and a control chip 106.

The sensor chip 105 and the control chip 106 are operatively coupled together and are housed within a package structure defined by the substrate 102 and by the cap 103 bonded together.

The substrate 102 comprises a core 107, an external metal layer 108, and an internal metal layer 109. A through hole in the substrate 102 defines a sound port 111.

The external metal layer 108 (FIG. 10) forms external contacts 112 and an external guard ring 113 around the sound port 111.

The internal metal layer 109 (FIGS. 9 and 11), on a face of the core 107 opposite to the external metal layer 108, defines internal contacts 115, a bonding ring 116 for the cap 103, and an internal guard ring 117 around the sound port 111. A solder mask 110 defines, with a portion of the internal metal layer 109, a contact island 121 around the external contacts.

An assembly base 122 is defined around the sound port 111 on the face of the core 107 on which the internal metal layer 109 is located. The base 122 is C-shaped and extends around the sound port 111, without obstructing it. The base 122 may, for example, be of metal, glass, or silicon and has a thickness substantially equal to the thickness of the control chip 106.

The control chip 106, which comprises signal-processing stages and components suitable for interacting with and enabling operation of the microelectromechanical microphone 100, is bonded to the core 107 of the substrate 102 by an adhesive layer 126 and is arranged adjacent to the base 122, without obstructing the sound port 111.

The sensor chip 105 integrates an electroacoustic transducer 135 (FIG. 11) substantially of the type already described with reference to FIGS. 1 to 4. In particular, the electroacoustic transducer 135 comprises a membrane 137, extending over a cavity 138, and a rigid metal backplate 140, capacitively coupled to the membrane 137 on the side opposite to the cavity 138. The cavity 138 is delimited on one side by the membrane 137 and is open on the opposite side.

The sensor chip 105 is bonded to the substrate 102 so as to be in acoustic communication with the outside of the package structure formed by the substrate 102 and the cap 103 through the sound port 111. In one embodiment, the sensor chip 105 is centered around the sound port 111.

In addition, the sensor chip 105 is longitudinally arranged in part on the control chip 106, which is substantially flush with an assembly surface 122a of the base 122. In greater detail, the sensor chip 105 has a first portion fixed to a face 106a of the control chip 106 and a second portion fixed to the base 122 around the sound port 111. Fixing is obtained by an adhesive layer 141, for example a glue or a soldering paste, which extends along the perimeter of the sensor chip 105.

The cap 103 is bonded to the substrate 102 along the bonding ring 116.

In this case, there are no constraints on the thickness of the control chip 106, since the base 122 may have an arbitrary thickness. Alignment between the face 106a of the control chip 106 and the base 122 to have a uniform bonding surface may be obtained by controlling the thickness of the base 122 during manufacture.

With reference to FIGS. 12-15, a microelectromechanical microphone according to another embodiment designated as a whole by the number 1a will now be described. The microelectromechanical microphone is different from the microelectromechanical microphone 1 in that control chip 6 is located in an opening of the through core 7 as well as other features that will be described in detail below.

The microelectromechanical microphone 1a includes a supporting substrate 2, a cap 3, a sensor chip 5, and a control chip 6. The sensor chip 5 and the control chip 6 are operatively coupled together.

The substrate 2 and the cap 3 are bonded together (FIG. 12) and form a package, which houses the sensor chip 5 and the control chip 6. The cap 3 has a protective function and further defines an acoustic chamber 4 of the microelectromechanical microphone 1.

In an embodiment, the substrate 2 may be a substrate of an LGA (Land-Grid Array) type and comprises a core 7, an outer metal layer 8 and an inner metal layer 9, for example made of copper and arranged on opposite faces of the core 7, and a solder mask 10. A through hole in the substrate 2 defines a sound port 11 and enables acoustic coupling of the inside of the package, in particular of the sensor chip 5, with the external environment.

A further through hole in the substrate 2 defines a through hole 34 in which the control chip 6 is at least partially housed.

The core 7 (FIGS. 14 and 15) is defined by a plate of rigid dielectric material, for example FR4, having a larger longitudinal dimension and a smaller transverse dimension.

The outer metal layer 8 (FIG. 13) is arranged on an outer face of the core 7, i.e., opposite to the cap 3. Defined in the outer metal layer 8 are first features, amongst which, in particular, external contacts 14 for electrical connection of the microelectromechanical microphone 1, and an outer guard ring 13 around the sound port 11. The outer guard ring 13 may be used also for connection to ground and is hence also referred to as "ground ring". A further solder mask 19 may be applied to the outer metal layer 8.

The inner metal layer 9 (FIGS. 12, 14, and 15) is arranged on an inner face of the core 7, closed by the cap 3. Defined in the inner metal layer 9 are second features, amongst which internal contacts 15, a bonding ring 16, along the perimeter of the core 7, an inner guard ring 17 around the sound port 11, and a supporting portion 18.

The cap 3 is fixed to the bonding ring 16.

The internal contacts 15 are electrically coupled to respective external contacts 14 by through vias 20 in the core 7. In one embodiment, the internal contacts 15 are aligned and are arranged at one end of the substrate 2 longitudinally opposite with respect to the sound port 11.

The solder mask 10 adheres to the supporting portion 18 of the inner metal layer 9. In one embodiment, the solder mask 10 and the supporting portion 18 are shaped for having, in plan view, a same profile and together define a contact island 21 around the internal contacts 15, and a mounting base 22 around the sound port 11. The contact island 21 and the base 22 are located at opposite sides of the through hole 34. The base 22 is adjacent to the hole 34.

The contact island 21 surrounds the internal contacts 15, separating them laterally from the rest of the conductive structures on the substrate 2.

The base 22 functions as anchorage for the sensor chip 5. For this purpose, the base 22 extends over an area sufficient to support the sensor chip 5 in a stable way straddling the sound port 11. In one embodiment, the base 22 extends around the sound port 11.

The control chip 6 houses an integrated control circuit or ASIC (Application-Specific Integrated Circuit), not illustrated in detail, which comprises signal-processing stages (for example, a charge-amplifier circuit for a capacitive electroacoustic sensor) and the components for interacting with and enabling operation of the microphone, in particular with regards to transduction of the acoustic signals.

The control chip 6 is housed in the through hole 34. In greater detail, in one embodiment the control chip 6 has a smaller length and width than the length and width of the through hole 34, so that the control chip 6 will not be directly in contact with at least one of the walls that delimit the through hole 34. Furthermore, the control chip 6 has a thickness substantially equal to the thickness of the substrate 2 and is contained in a region delimited by an inner face 2a and by an outer face 2b of the substrate 2. In other words, the control chip 6 has an inner face 6a aligned to the inner face 2a of the substrate 2 and an outer face 6b aligned to the outer face of the substrate 2. In one embodiment (not shown), in which there are no solder masks on the two faces of the substrate 2, the control chip 6 has the inner face 6a and the outer face 6b aligned, respectively, to an outer face and to an inner face of the core 7 of the substrate 2. Possibly, the control chip 6 may undergo machining or a chemico-mechanical surface treatment in order to adapt the thickness to the depth of the through hole 34. Also the case where the face 6a of the control chip 6 is recessed or projects slightly may be tolerated without need for particular measures for offsetting any misalignment.

The control chip 6 is connected to the substrate 2 and held within the through hole 34 by a fixing frame 32, which occupies the space between the control chip 6 and the walls that delimit the through hole 34. The fixing frame 32 may, for example, be made by molding of polymeric material, as explained hereinafter. To favour production of the fixing frame 32 using molding techniques, the solder mask 10, and a corresponding portion of the inner metal layer 9 may extend along the sides of the through hole 34 between the contact island 21 and the base 22.

On the inner face 6a, the control chip 6 has contact pads 28 for coupling to the internal contacts 15 through first wire bondings 30 and to the sensor chip 5 through second wire bondings 31.

An electroacoustic transducer 35 (FIGS. 14 and 15) is integrated in the sensor chip 5 and, in one embodiment, comprises a membrane 37 of semiconductor material, stretched over a cavity 38 formed in the body 5a of the sensor chip 5, and a rigid metal backplate 40, capacitively coupled to the membrane 37. The backplate 40 is provided with holes and is arranged alongside the membrane 37 on the side opposite to the cavity 38. The cavity 38 is delimited on one side by the membrane 37 and is open on the opposite side.

The sensor chip 5 is bonded to the substrate 2 so that the membrane 37 is in acoustic communication with the outside of the package formed by the substrate 2 and by the cap 3 through the sound port 11. In one embodiment, the sensor chip 5 is centred around the sound port 11.

Furthermore, the sensor chip 5 is partially arranged on top of the control chip 6, which, as already mentioned, is substantially aligned to the solder mask 10. In greater detail, the sensor chip 5 has a first portion fixed to the face 6a of the control chip 6 and a second portion fixed to the base 22 around the sound port 11. Fixing is obtained by an adhesive layer 41, for example a glue or a solder paste, which extends in part over the base 22 and in part over the face 6a of the control chip 6, along the perimeter of the sensor chip 5.

Given the same dimensions, the superposition of the sensor chip 5 and of the control chip 6, with the control chip 6 arranged in the through hole 34 and the sensor chip 5 partially fixed to the base 22, enables reduction of the total area occupied, without increasing the total thickness of the microelectromechanical microphone 1. Conversely, given the same area occupied, the sensor chip 5 and the control chip 6 may have larger dimensions, to the advantage of performance. Furthermore, given that the through hole 34 for housing the control chip 6 extends basically throughout the thickness of the substrate 2, the dimensions of the control chip 6 may be adapted to the through hole 34 with a minimal thinning, if so desired. In other cases, the control chip 6 may be housed without any type of preliminary thinning process.

Figure 16:
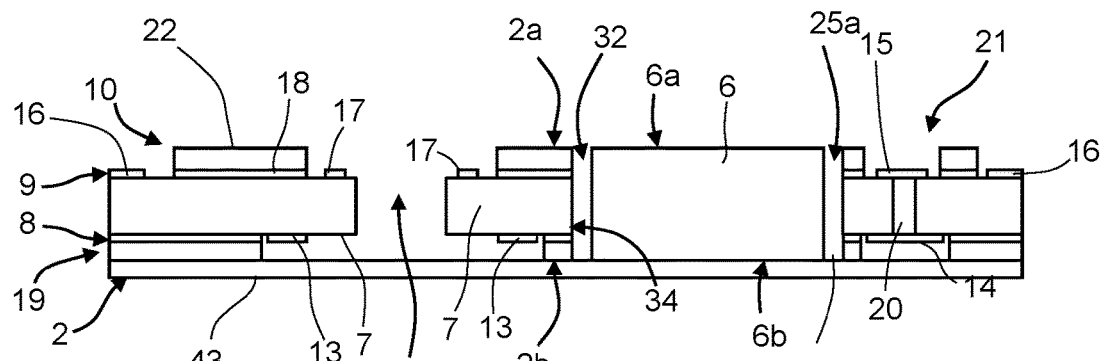
FIG. 16 is a cross-sectional view of the microelectromechanical microphone of FIG. 12 in a first step of a manufacturing process, according to an embodiment.
Figure 17:
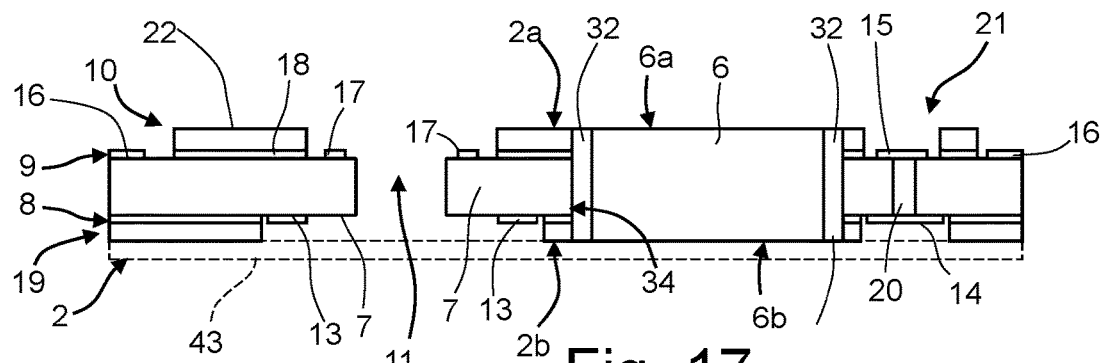
FIG. 17 shows the view of FIG. 16 in a second step of the manufacturing process.

The microelectromechanical microphone 1 may be obtained as described in what follows, with reference to FIGS. 16 and 17.

Initially, the substrate 2 is prepared. Preparation of the substrate 2 includes definition of the outer metal layer 8, of the inner metal layer 9, of the solder mask 10, and of the solder mask 19 for providing the features on the faces of the substrate 2, amongst which, in particular, the contact island 21, the base 22, the outer guard ring 13, the inner guard ring 17, the bonding ring 16 and the contacts 14, 15. Preparation further includes drilling of the substrate 2 for providing the sound port 11 and the through hole 34 for housing the control chip 6.

An adhesive-tape support 43 is applied to a face of the substrate 2, for example the outer face 2b, as illustrated in FIG. 16. The adhesive-tape support 43 may cover the entire outer face 2b of the substrate 2 and in any case closes the through hole 34 on one side.

By a pick-and-place operation, the control chip 6 is then introduced into the through hole 34 from the open side of the latter and is bonded to the adhesive-tape support 43. The adhesive-tape support 43 holds the control chip 6 within the through hole 34. The space between the wall of the through hole 34 and the control chip 6 (in practice a frame that has a thickness substantially equal to the thickness of the substrate 2 and a shape corresponding to that of the fixing frame 32) defines a mold 32a that is filled with polymeric material by a molding operation, for example according to a technique of film-assisted molding. The fixing frame 32 is thus formed, as illustrated in FIG. 17.

After the adhesive-tape support 43 has been removed, the microelectromechanical microphone 1 is completed by bonding the sensor chip 5 to the substrate 2 and, in part, to the control chip 6, to obtain the wire bondings 30, 31 and by bonding the cap 3 to the substrate 2 along the bonding ring 16.

Figure 18:
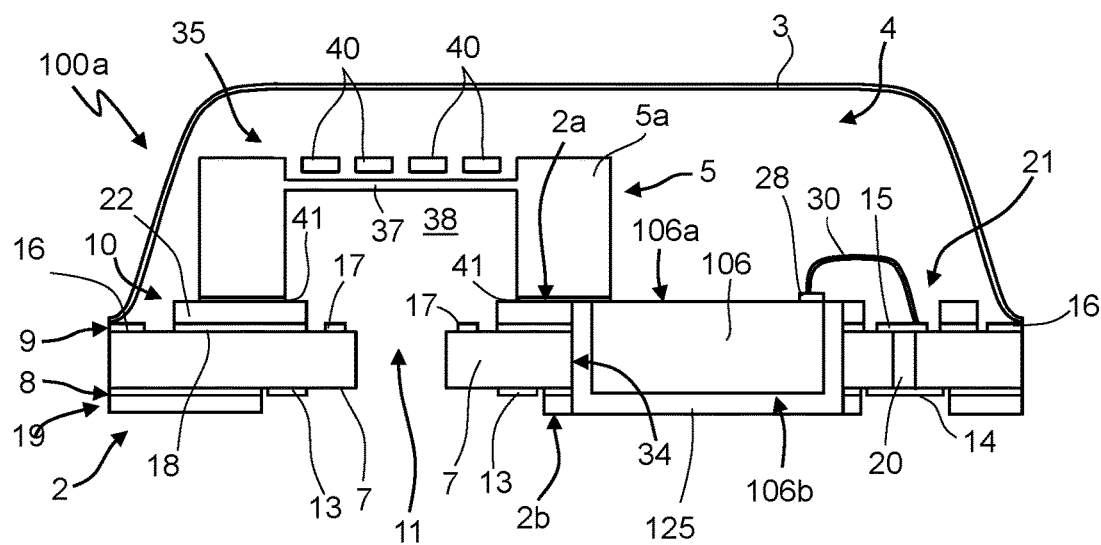
FIG. 18 is a cross-sectional view through a microelectromechanical microphone according to a different embodiment.

In a different embodiment of the disclosure (illustrated in FIG. 18), the control chip, here designated by 106, has a thickness smaller than that of the substrate 2, in particular a thickness smaller than that of the core 7 of the substrate 2. The control chip 106 is housed in the through hole 34, with an inner face 106a aligned to the inner face 2a of the substrate 2, and is connected to the substrate 2 by a fixing structure 125. The fixing structure 125 is cup-shaped and also covers an outer face 106b of the control chip 106, in addition to its lateral surfaces. The bottom of the fixing structure 125 is aligned to the outer face 2b of the substrate 2.

Also in this case, a microelectromechanical microphone 100 may be produced with the aid of an adhesive-tape support.

Figure 19:
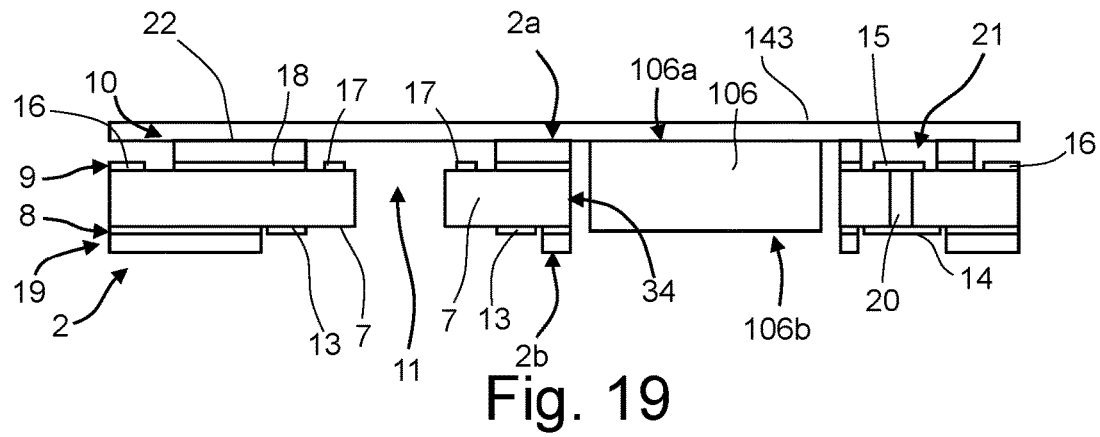
FIG. 19 is a cross-section of the microelectromechanical microphone of FIG. 18 in a first step of a manufacturing process, according to a further embodiment.

With reference to FIG. 19, after preparation of the substrate 2, an adhesive-tape support 143 is applied to the inner face 2a of the substrate 2. By a pick-and-place operation, the control chip 6 is arranged in the through hole 12 and held therein by the adhesive-tape support 143.

Figure 20:
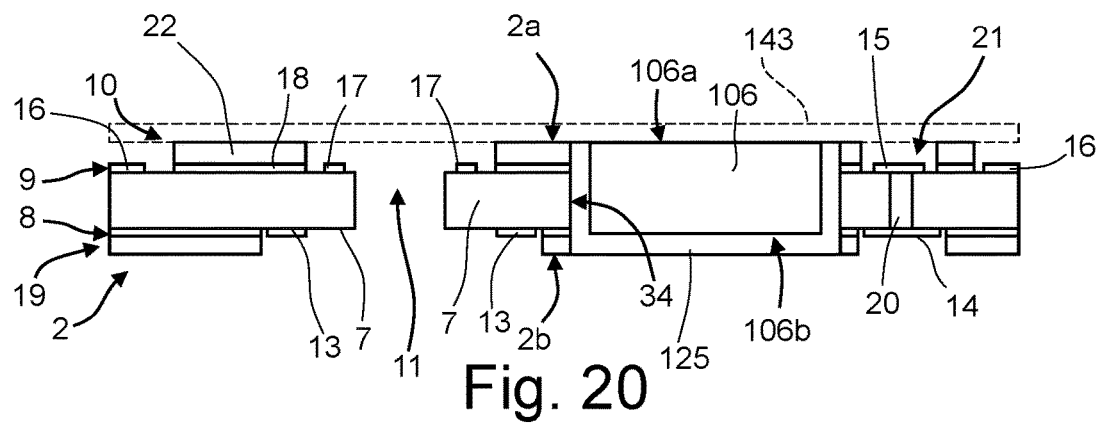
FIG. 20 shows the view of FIG. 19 in a second step of the manufacturing process.

The fixing structure 125 is then provided by molding, for example using the pin-gate-molding technique (FIG. 20), and the adhesive-tape support 143 is removed.

Finally, the sensor chip 5 is bonded to the substrate 2 and in part to the control chip 6, the wire bondings 30, 31 are provided, and the cap 3 is bonded to the substrate 2 along the bonding ring 16.

Figure 21:
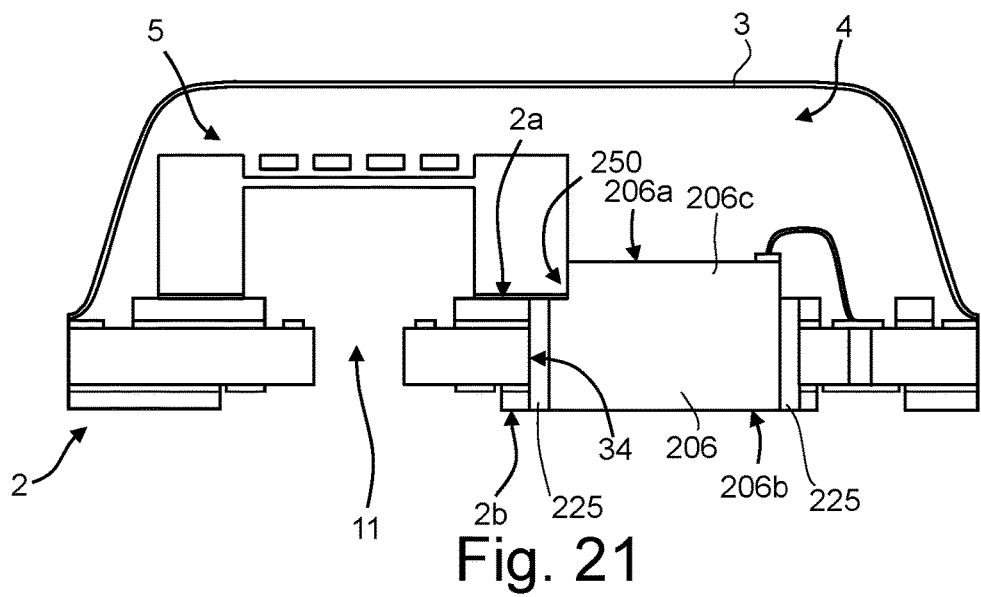
FIG. 21 is a cross-sectional view through a microelectromechanical microphone according to a different embodiment.

According to one embodiment, illustrated in FIG. 21, in a microelectromechanical microphone 200 the control chip, here designated by 206, may have a thickness greater than that of the substrate 2. In this case, the control chip 206 is housed only partially in the through hole 12 and is connected to the substrate 2 by a fixing frame 225 of polymeric material, for example obtained by molding. In particular, the control chip 206 has an outer face 206a aligned to the outer face 2b of the substrate 2 and projects from the through hole 12 towards the inside of the acoustic chamber 4. In greater detail, the control chip 206 has a projecting portion 206c and a recess 250 that accommodates part of the sensor chip 5. The recess 250 is obtained by etching the control chip 206 and is delimited by a base, aligned to the inner face 2a of the substrate 2, and by a wall substantially perpendicular to the base. In practice, the projecting portion 206c of the control chip forms a step with respect to the base of the recess 250. An edge of the sensor chip 5 adjacent to the control chip 206 is housed in the recess 250 and may be bonded to the portion of the control chip 206 that defines the base of the recess 250.

The microelectromechanical microphone 200 may be assembled following the process described in FIGS. 16 and 17.

Figure 22:
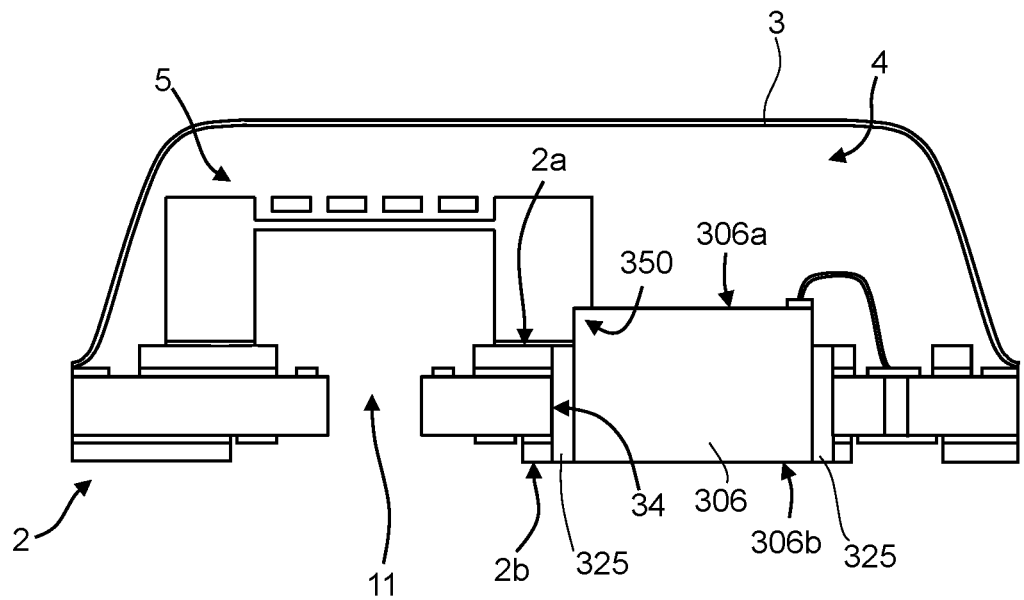
FIG. 22 is a cross-sectional view through a microelectromechanical microphone according to a different embodiment.

According to the embodiment illustrated in FIG. 22, in a microelectromechanical microphone 300 the control chip, here designated by 306, is partially housed in the through hole 12 and, since it has a thickness greater than that of the substrate 2, projects towards the inside of the acoustic chamber 4. In a portion of the sensor chip 305 adjacent to the control chip 306, a recess 350 is provided that houses an edge of the control chip 306 itself. The recess 350 is obtained by etching the sensor chip 305 at its base, in a position adjacent to the control chip 306, and is delimited by two walls that are parallel one to a side face and the other to the inner face 306a of the control chip 306. A part of the sensor chip 305 is arranged on top of the control chip 306 and may be bonded thereto.

Also in this case, the control chip 306 is connected to the substrate 2 by a fixing frame 325 of polymeric material, which is obtained by molding and occupies the space between the control chip 306 and the wall that delimits the through hole 12. Furthermore, an outer face 306b of the control chip 306 is aligned to the outer face 2b of the substrate 2.

Figure 23:
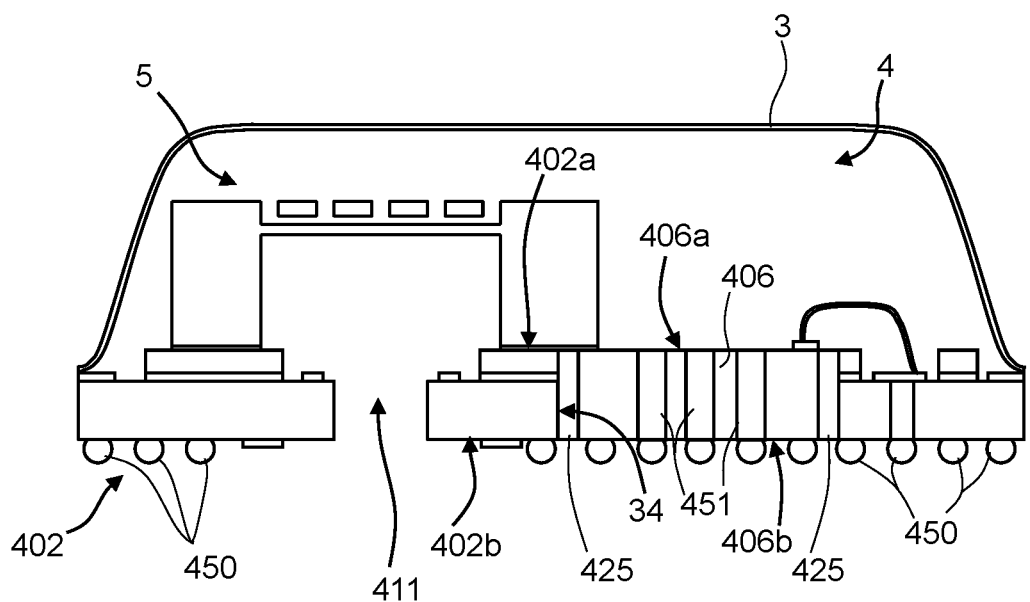
FIG. 23 is a cross-sectional view through a microelectromechanical microphone according to a different embodiment.
Figure 24:
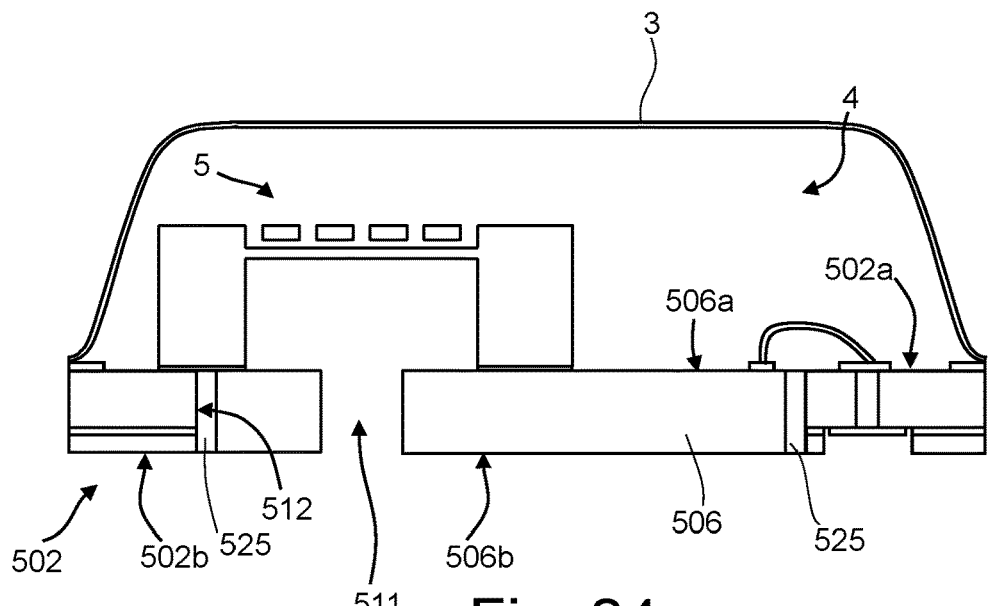
FIG. 24 is a cross-sectional view through a microelectromechanical microphone according to a different embodiment.

FIG. 23 illustrates an embodiment of the disclosure in which the substrate and the control chip, here designated, respectively, by 402 and 406, are connected together by a fixing frame 425 of polymeric material and are both provided with contacts 450 of a BGA (Ball-Grid Array) type. In this case, part of the electrical connections between the inner face 406a and the outer face 406b of the control chip 406 are obtained by TSVs (Through Silicon Vias) 451 provided in the control chip 406 itself. Wire bondings are used for connecting the sensor chip 5 to the control chip 406. Connection paths (not illustrated) may be provided, as desired, directly on a face of the control chip 406.

In one embodiment (not shown), the connections from inside the acoustic chamber 4 to the outside may be obtained in part as through vias in the control chip 406 and in part as wire bondings and through vias in the substrate 402.

According to the embodiment illustrated in FIG. 23, the control chip, here designated by 506, is housed in a through hole 512 of the substrate 502, in this case without projecting beyond the inner face 502a and the outer face 502b of the substrate 502. The control chip 506 is connected to the substrate 502 by a fixing frame 525 of polymeric material.

The sensor chip 505 is bonded partly to an inner face 502a of the substrate 502 and partly to an inner face 506a of the control chip 506, which are aligned to one another.

A sound port 511 is defined by a through hole in the control chip 506 and enables acoustic coupling of the inside of the package formed by the cap 3, the substrate 502, and the control chip 506 with the external environment.

Figure 25:
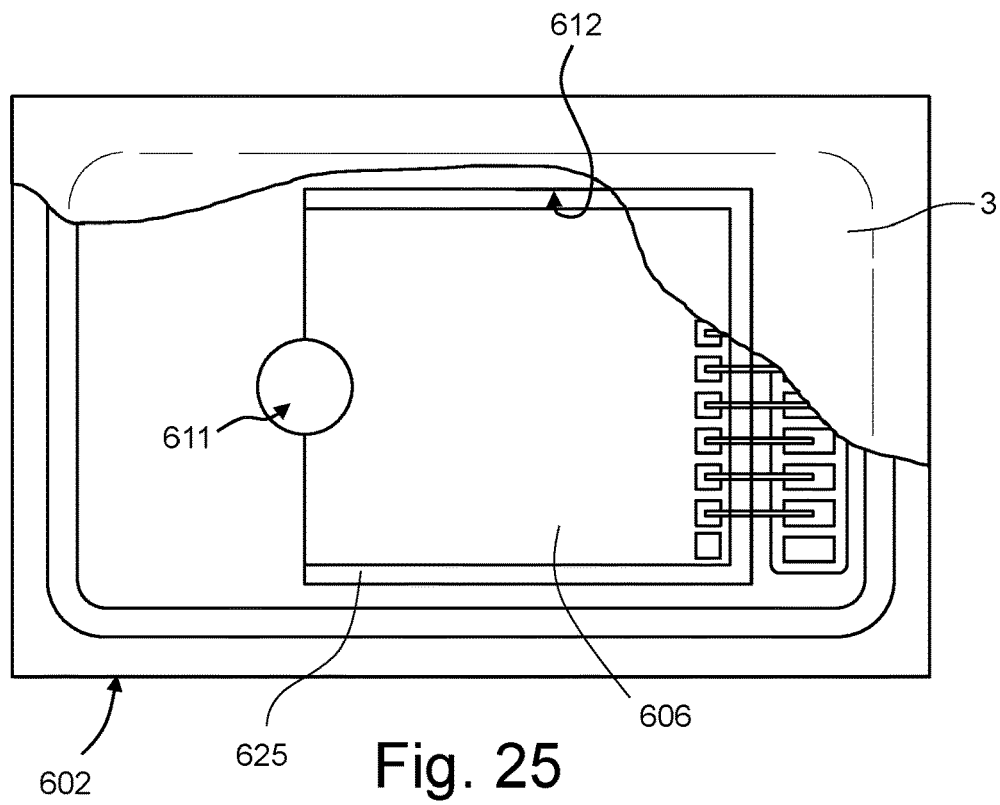
FIG. 25 is a top plan view, partially sectioned and with parts removed for clarity, of a microelectromechanical microphone according to a further embodiment.

According to the embodiment of FIG. 25, the substrate and the control chip, which are designated by 602 and 606, respectively, each define a corresponding portion of sound port 611. In other words, the sound port 611 is obtained by removal of a portion of the substrate 602 and a portion of the control chip 606 and is defined when the control chip 606 is housed in its through hole 612 within the substrate 602. The control chip 606 is housed in a through hole 612 and connected to the substrate 602 by a fixing frame 625.

Figure 26:
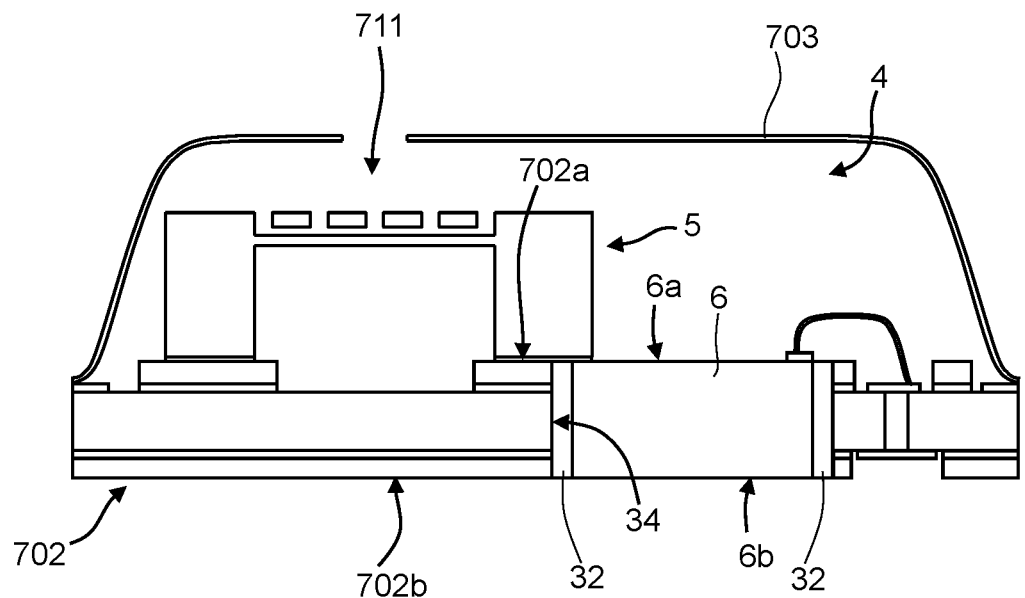
FIG. 26 is a cross-sectional view through a microelectromechanical microphone according to a different embodiment.

The embodiment illustrated in FIG. 26 differs from the embodiment of FIGS. 12-15 in that the sound port, here designated by 711, is provided in the cap 703. In this case, then, the substrate 702 is continuous in the region corresponding to the sensor chip 5.

Figure 27:
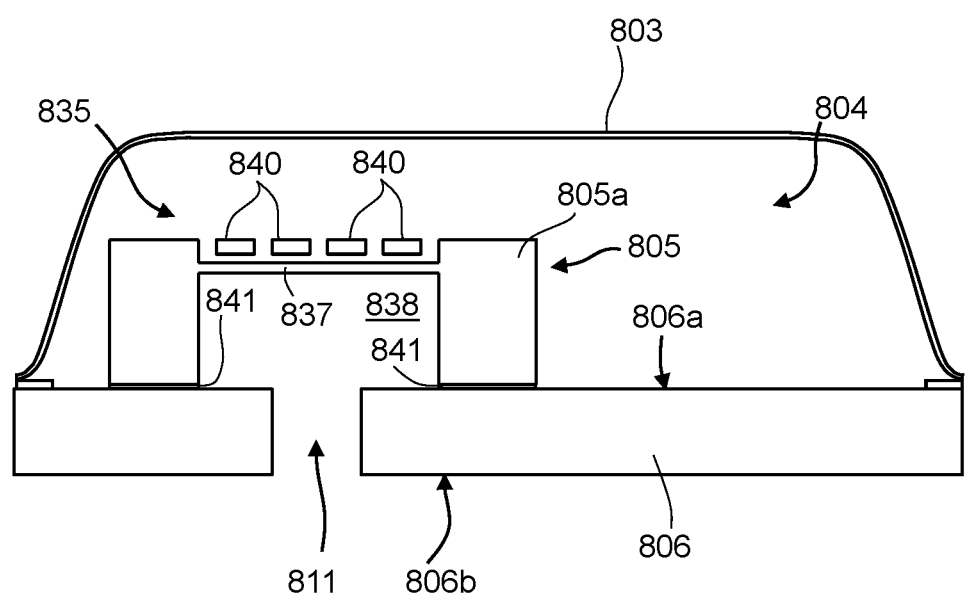
FIG. 27 is a cross-sectional view through a microelectromechanical microphone according to a different embodiment.

With reference to FIG. 27, according to an embodiment of the disclosure, a microelectromechanical microphone 800 comprises a cap 803, a sensor chip 805, and a control chip 806.

The control chip 806, which functions as supporting substrate, and the cap 803 are bonded together along the perimeter of the cap 803 and form a package, which houses the sensor chip 805. The cap 803 has a protective function and, further, defines with the control chip 806 an acoustic chamber 804 of the microelectromechanical microphone 800.

The control chip 806 is, for example, of the BGA type and houses an integrated control circuit (not shown in detail), which comprises signal-processing stages (for example, a charge-amplifier circuit for a capacitive electroacoustic sensor) and the components useful for interacting with and enabling operation of the microphone, in particular in regards to transduction of the acoustic signals.

The control chip 806 has a through hole that defines a sound port 811 and enables acoustic coupling of the inside of the package, in particular of the sensor chip 805, with the external environment.

An electroacoustic transducer 835 is integrated in the sensor chip 805 and, in one embodiment, comprises a membrane 837 of semiconductor material, stretched over a cavity 838 formed in the body 805a of the sensor chip 805, and a rigid metal backplate 840, capacitively coupled to the membrane 837. The backplate 840 is provided with holes and is arranged alongside the membrane 837 on the side opposite to the cavity 838. The cavity 838 is delimited on one side by the membrane 837 and is open on the opposite side.

The sensor chip 805 is bonded to an inner face 806a of the control chip 806 so that the membrane 837 is in acoustic communication with the outside of the package formed by the control chip 806 and by the cap 803 through the sound port 811. Fixing is obtained by an adhesive layer 841 that extends over the face 806*a* of the control chip 806 around the sound port 811.

It is to be appreciated that the various embodiments enable saving of a substrate otherwise used substantially for mechanical support and for providing electrical connections, but without an active role in the process of transduction of the acoustic signals.

Figure 28:
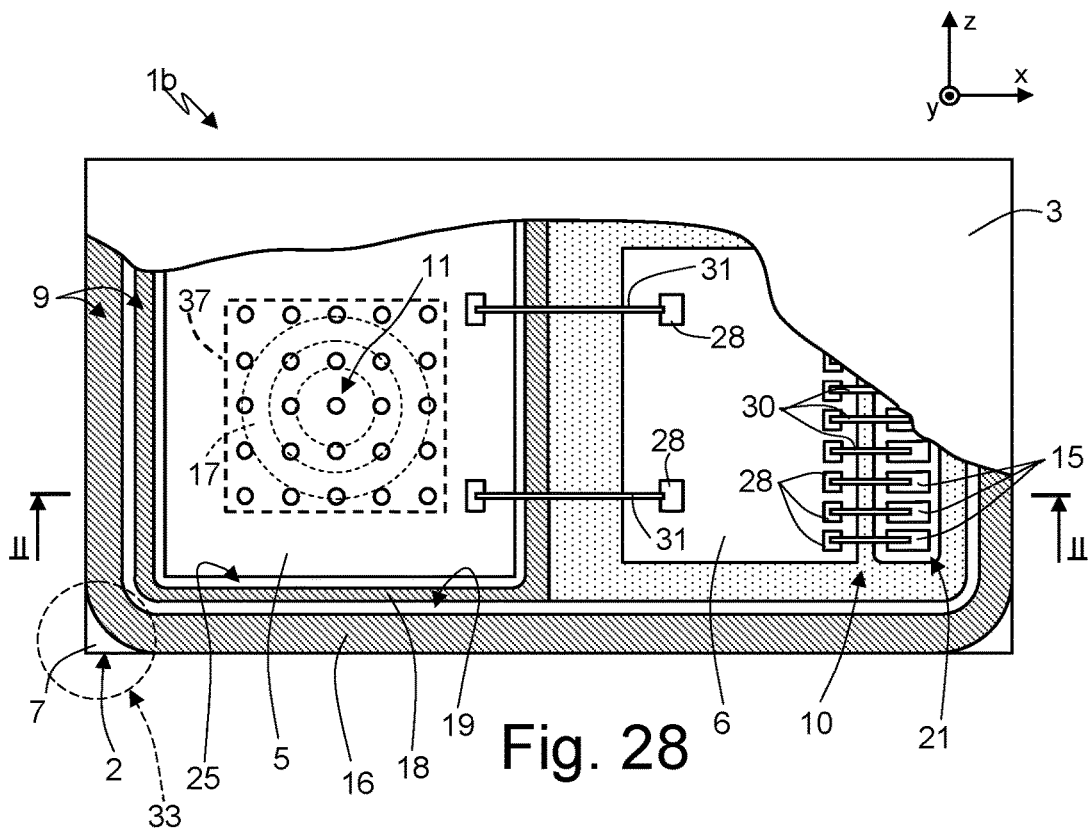
FIG. 28 is a top plan view, partially sectioned along a longitudinal plane, of a microelectromechanical microphone according to another embodiment.
Figure 29:
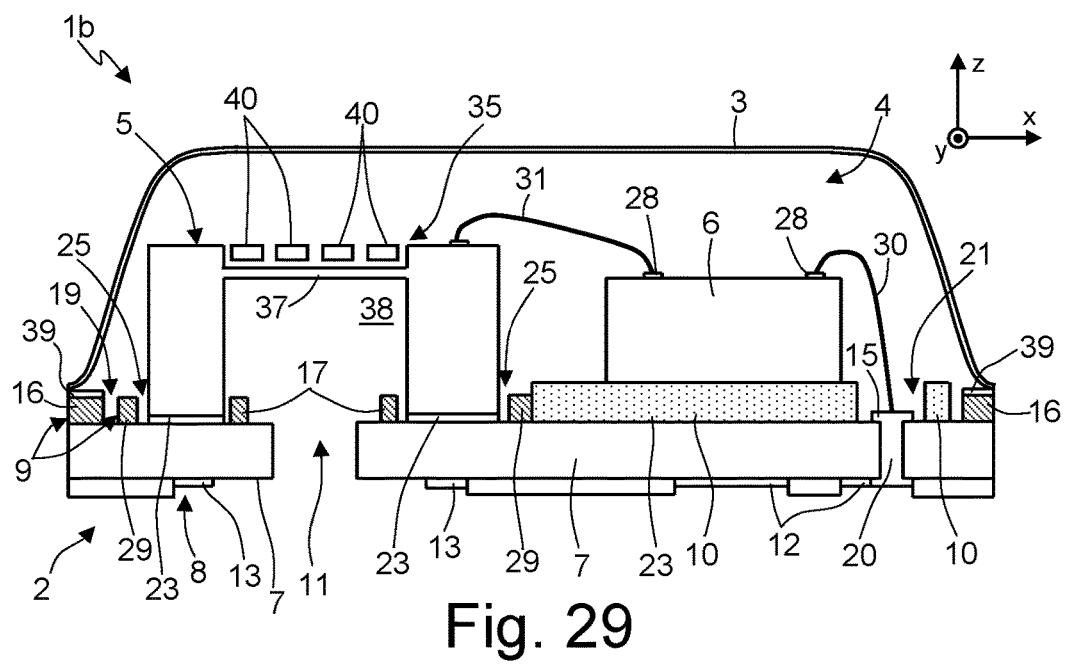
FIG. 29 is a lateral sectional view of the microelectromechanical microphone of FIG. 28, sectioned along the line II-II of FIG. 28.
Figure 30:
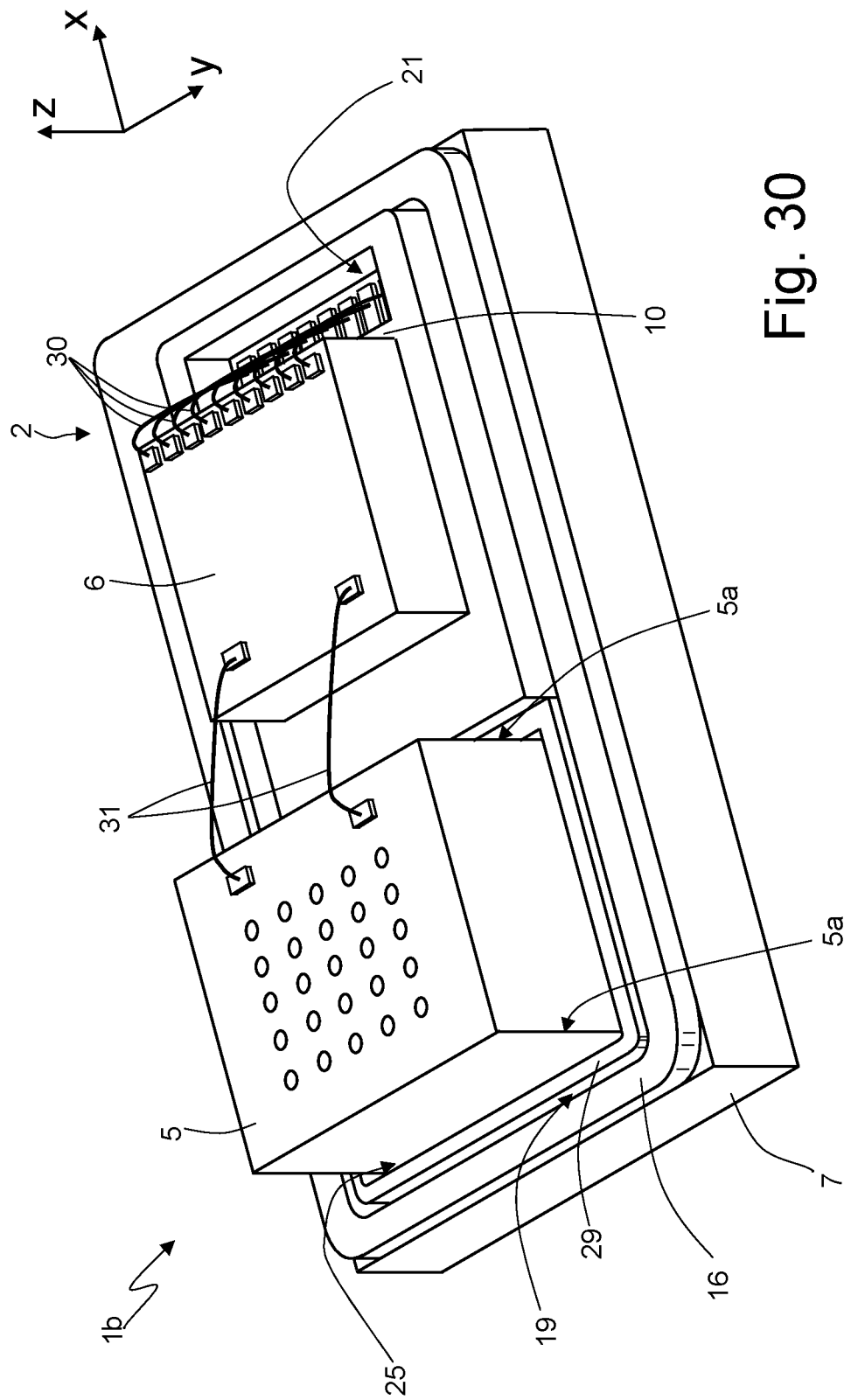
FIG. 30 is a perspective view of the microelectromechanical microphone of FIGS. 28 and 29.

With reference to FIGS. 28-30, a microelectromechanical microphone 1*b* is provided according to one embodiment of the present disclosure. FIG. 28 shows a top plan view of the microelectromechanical microphone 1*b*, in a plane XY. FIG. 29 shows a lateral sectional view of the microelectromechanical microphone 1, in a plane XZ. FIG. 30 shows a perspective view of the microelectromechanical microphone 1*b*, in a triaxial system XYZ.

The microelectromechanical microphone is different from the microelectromechanical microphones 1 and 1*a* in that control chip 6 is located on xx 10, as well as other features that will be described in detail below.

The microelectromechanical microphone 1*b* comprises a substrate 2, a cap 3, a sensor chip 5, and a control chip 6. The sensor chip 5 and the control chip 6 are operatively (e.g., electrically) coupled together, for example by bonding wires 31.

It is here pointed out that, for simplicity of representation, FIG. 30 illustrates the microelectromechanical microphone 1*b* without the cap 3, so that the internal structure of the microelectromechanical microphone 1*b* and the mutual arrangement of the elements that form the microelectromechanical microphone 1*b* itself are appreciated more readily.

The substrate 2 and the cap 3 are coupled together by a solder-paste region 22 and form a package structure defining an internal cavity 4, in which the sensor chip 5 and the control chip 6 are housed. The cap 3 has a protective function. The internal cavity 4 forms an acoustic chamber of the microelectromechanical microphone 1*b*.

In one embodiment, the substrate 2 is a substrate of the LGA (Land Grid Array) type and comprises: a core 7; bottom metal regions 8 and top metal regions 9, for example of copper, which extend on opposite faces of the core 7; and a solder mask 10. A through hole in the substrate 2 defines a sound port 11 and enables acoustic coupling of the inside of the package structure, in particular of the sensor chip 5, with the external environment.

Figure 3:
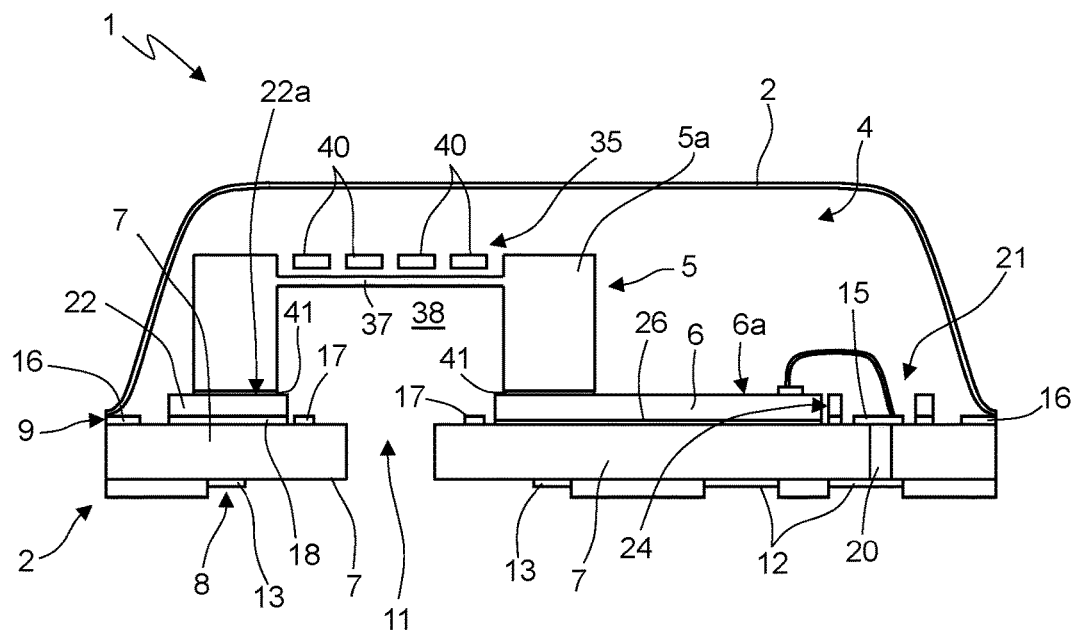
FIG. 3 is a side view of the microelectromechanical microphone of FIG. 1, sectioned along the line III-III of FIG. 1.
Figure 4:
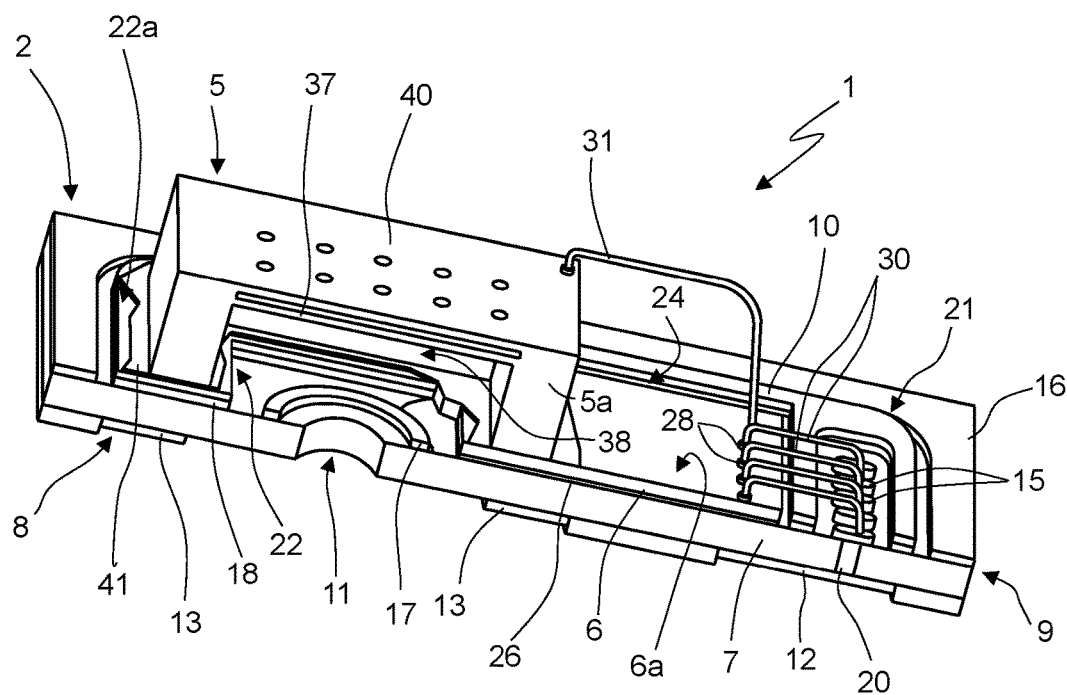
FIG. 4 is a perspective view of the microelectromechanical microphone of FIG. 1, sectioned along the line III-III of FIG. 1 and with parts removed for clarity.
Figure 5:
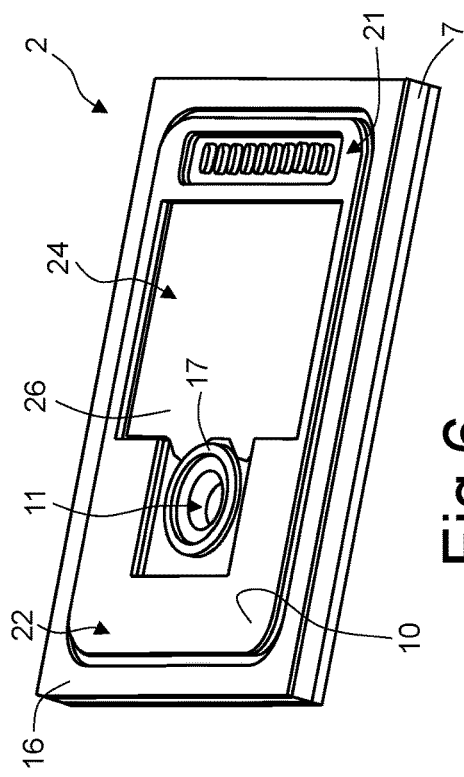
FIGS. 5-8 are perspective views of the microelectromechanical microphone of FIG. 1 during an assembly procedure.

The core 7, which is more clearly visible in FIGS. 29 and 3, is defined by a chip of rigid dielectric material, for example FR4, having a longitudinal dimension and a transverse dimension. In particular, the longitudinal dimension is greater than the transverse dimension.

The bottom metal regions 8 are arranged on a face of the core 7 facing the external environment, i.e., opposite to the cap 3. In particular, defined in the bottom metal regions 8 are external contacts 12 for electrical connection of the microelectromechanical microphone 1*b* and, optionally, an external guard ring 13, which surrounds the sound port 11. The external guard ring 13 may be used also for connection to ground and is thus also referred to as "ground ring".

The top metal regions 9 extend on a face of the core 7 facing the sensor chip 5, and are protected by the cap 3. Defined in the top metal regions 9 are internal contacts 15, a bonding ring 16, which extends along the perimeter of the core 7, an inner guard ring 17, which surrounds the sound port 11, and a barrier ring 29, which extends over the core 7 between the bonding ring 16 and the outer perimeter of the sensor chip 5. In greater detail, the barrier ring 29 extends at a distance from the bonding ring 16, thus defining a trench 19 between the barrier ring 29 and the bonding ring 16. Through the trench 19 a respective surface region of the core 7 is exposed.

The barrier ring 29 likewise extends at a distance from the outer perimeter of the sensor chip 5, thus defining a further trench 25 between the barrier ring 29 and the outer edge of the sensor chip 5. The trench 25 has the function of containing a possible excess of glue of the bonding layer 23, which could expand laterally to the sensor chip 5 during the step of bonding of the sensor chip 5 on the substrate 2. The distance between the barrier ring 29 and the sensor chip 5 (i.e., the width of the trench 25) is chosen comprised between 50 µm and 100 µm, for example 75 µm. The distance between the barrier ring 29 and the bonding ring 16 (i.e., the width of the trench 19) is chosen comprised between 30 µm and 70 µm, for example 50 µm.

The internal contacts 15 are electrically coupled to respective external contacts 12 (belonging to the bottom metal regions 8) through vias 20, of metal material, which extend throughout the thickness of the core 7. In one embodiment, the solder mask 10 is shaped for defining an assembly base for the supporting chip 6 and a contact island 21 that houses the internal contacts 15. The contact island 21 is formed as a recess in the solder mask 10 so that the internal contacts 15 rest directly on the core 7 and are in direct connection with the through vias 20.

The internal contacts 15 are thus separated laterally from the rest of the conductive structures present on the face of the substrate 2, the latter facing the cap 3.

The control chip 6 houses, for example, an ASIC (not illustrated in detail in so far as it is per se known), which comprises signal-processing circuits (for example, a charge-amplifier circuit for a capacitive electro-acoustic sensor) and the components for interacting with and enabling operation of the microphone, in particular with regards to transduction of the acoustic signals. According to the embodiment of FIGS. 28-30, the control chip 6 is located between the sensor chip 5 and the contact island 21.

According to a different embodiment (not illustrated), the contact island 21 extends between the control chip 6 and the sensor chip 5.

The control chip 6 has contact pads 28 for connection to the internal contacts 15 by first wire bondings 30 and to the sensor chip 5 by second wire bondings 31.

An electroacoustic transducer 35 is integrated in the sensor chip 5 and, in one embodiment, comprises a membrane 37 of semiconductor material, which extends over a cavity 38 formed in the body 5*a* of the sensor chip 5, and a rigid metal backplate 40, capacitively coupled to the membrane 37. The backplate 40 is provided with holes and is arranged alongside the membrane 37 on the side opposite to the cavity 38. The cavity 38 is delimited on one side by the membrane 37 and faces, on the opposite side, the sound port 11.

In other words, the sensor chip 5 is coupled to the substrate 2 so that the membrane 37 is in acoustic communication with the outside of the package structure formed by the substrate 2 and by the cap 3 through the sound port 11. In one embodiment, the sensor chip 5 is centred around the sound port 11.

The sensor chip 5 is coupled to the core 7 of the substrate 2 by a bonding layer 23 of glue, in particular, epoxy glue. The bonding layer 23 extends between the barrier ring 29 and the inner guard ring 17. In this way, the barrier ring 29 prevents contamination of the bonding ring 16 by the glue of the bonding layer 23 in so far as it functions as barrier for the glue. If the glue were to contaminate the bonding ring 16, this would jeopardize bonding of the solder paste, thus causing incomplete soldering of the cap 3 or else malfunctioning of the microphone, up to possible detachment of the cap 3.

The inner guard ring 17 prevents the glue of the bonding layer 23 from flowing towards, and into, the hole that constitutes the sound port 11. Thus, according to one aspect of the present disclosure, the glue of the bonding layer 23 remains confined between the barrier ring 29 and the inner guard ring 17.

The present applicant has found that thicknesses of the inner guard ring 17 that enable the aforesaid purpose to be achieved are comprised between 15 µm and 25 µm, for example 20 µm, with a width, measured in the direction of the axis X, of at least 30 µm.

The barrier ring 29 has likewise the function of preventing the solder paste of the solder-paste region 29 from flowing towards the sensor chip 5. In fact, if the solder paste were to contaminate the region where the sensor chip 5 and the control chip 6 are positioned, this could cause a short circuit between the electrical contacts (e.g., bonding wires) present in this region; an excess of solder paste could even extend over the sensor chip (thus damaging the vibrating membrane) and the control chip (thus damaging it).

For this purpose, the trench 19 has the function of containing a possible excess of solder paste that might drip from the bonding ring 16 towards the inside of the acoustic chamber 4. This possible excess of solder paste thus remains trapped within the trench 19, without being able to flow beyond the barrier ring 29.

The barrier ring 29 has a thickness comprised between 15 µm and 25 µm, for example 20 µm.

An improvement of the performance of the microelectromechanical microphone 1b may be obtained using sensor chips 5 of larger size, i.e., provided with a more extensive membrane that affords an increase in sensitivity. In this context, the mutual dimensions of all the elements that form the micro-electro-mechanical microphone assume a fundamental importance. For instance, the width of the trenches 19 and 25 are carefully monitored since, in the event of partial narrowing, the respective trench 19, 25 might no longer be able to contain effectively the solder paste 29 and the glue of the bonding layer 23, respectively. In particular, it is to be noted that, for the manufacturing processes commonly used, the normal procedure is to provide the bonding ring 16 with some, or all, the corners rounded, as may be seen in the region 33 surrounded by a dashed line in FIG. 28. In order to keep a constant distance between the barrier ring 29 and the bonding ring 16 (so that the effect of protection provided by the trench 19 is effective along the entire barrier 19), according to one aspect of the present disclosure also the barrier ring 29 is made with rounded corners, at least for the ones that correspond to the rounded corners of the bonding ring 16. However, sensor chips 5 of a known type typically have a quadrangular shape with sharp corners 5a. This causes a reduction of the distance between the sensor chip 5 and the barrier ring 29 at the corners 5a of the sensor chip 5, where the latter directly face the rounded corners of the barrier ring 29; the consequence is a narrowing of the trench 25 at the corners 5a of the sensor chip 5. A narrowing of this type may be such as to jeopardize the capacity of the trench 25 to contain the glue, which spreads out of the bonding region 23 as a result of the pressure exerted by the sensor chip 5 during assembly thereof.

In order to overcome this problem, an undesired solution is that of increasing further the width of the trench 25, which, however, causes an increase in the dimensions of the microelectromechanical microphone 1b.

Figure 31:
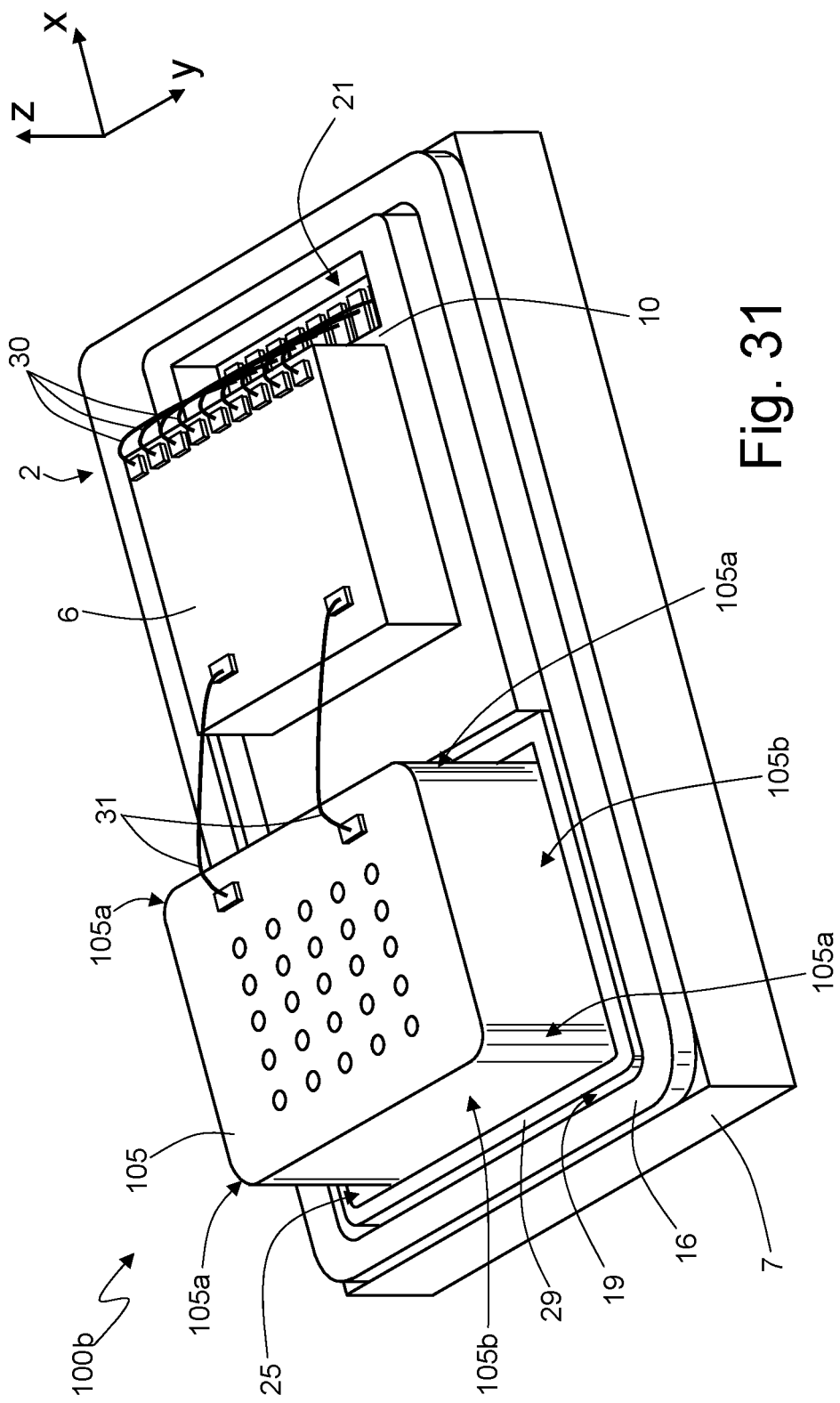
FIGS. 31-34 are respective perspective views of microelectromechanical microphones according to further embodiments.

According to one aspect of the present disclosure a microelectromechanical microphone 100b of the type illustrated in FIG. 31 is provided. The microelectromechanical microphone 100b includes a sensor chip 105 of a polygonal shape (in this case, quadrangular) defined by faces 105b radiused to one another by rounded corners 105a, which have a radius of curvature equal to the radius of curvature that the barrier ring 29 presents in corresponding rounded corner regions. In this context, the term "rounded corner" indicates a corner that is not sharp, i.e., is defined by a curvilinear radiusing of two faces 105b of the sensor chip 105.

In other words, according to the embodiment of FIG. 31, the outer perimeter of the sensor chip 105 follows, at a definite constant distance from the trench 25, the inner perimeter of the barrier ring 29. In this way, the trench 25 has a width (defined as distance between a point of the outer perimeter of the sensor chip 105 and a respective point, aligned along X or along Y, of the inner perimeter of the barrier ring 29) that is constant along the entire perimeter of the sensor chip 105.

Rounding of the corners 105a of the sensor chip 105 may be obtained in a per se known manner, for example by laser cutting or plasma cutting.

Figure 32:
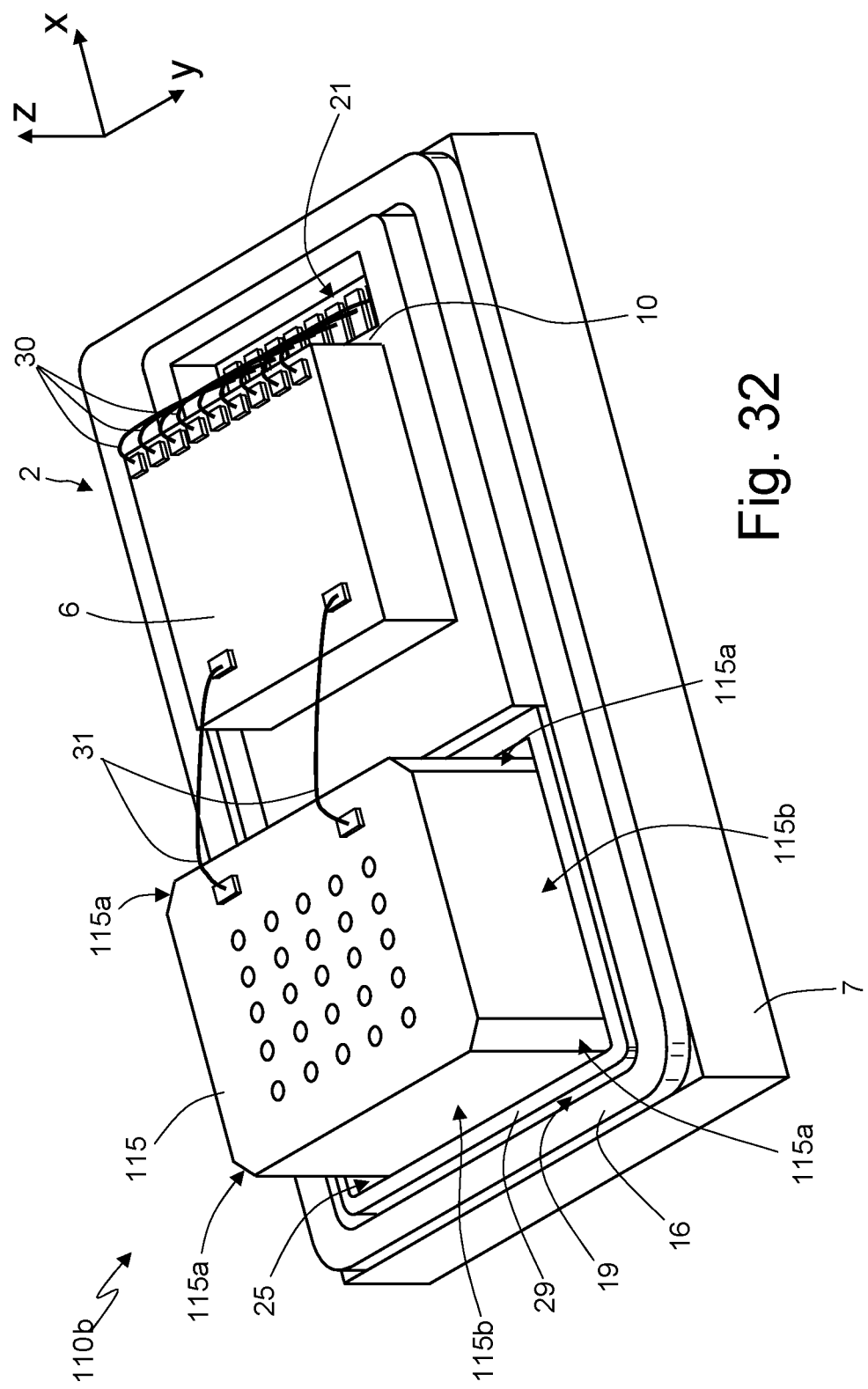

FIG. 32 shows an embodiment alternative to that of FIG. 31, designed to obtain similar advantages.

Illustrated in FIG. 32 is a microelectromechanical microphone 110b. The microelectromechanical microphone 110b includes a sensor chip 115 with chamfered corners 115a. Unlike the embodiment of FIG. 31, in this case the corners 115a of the sensor chip 115 are not rounded, but cut, for example by laser cutting or plasma cutting. Thus, after cutting, the corners 115a have a chamfered region that is substantially planar and not rounded, as in the embodiment of FIG. 31.

In the context of the present disclosure, the term "chamfered corner" indicates a corner that is not sharp, but cut, i.e., having a planar radiusing between two adjacent faces 115b.

Chamfering of the corners is performed so that, at the end of the machining steps, the trench 25 has a width, at the chamfered corners 115a, that is the same as or greater than the width along the lateral faces 115b of the sensor chip 115.

Figure 33:
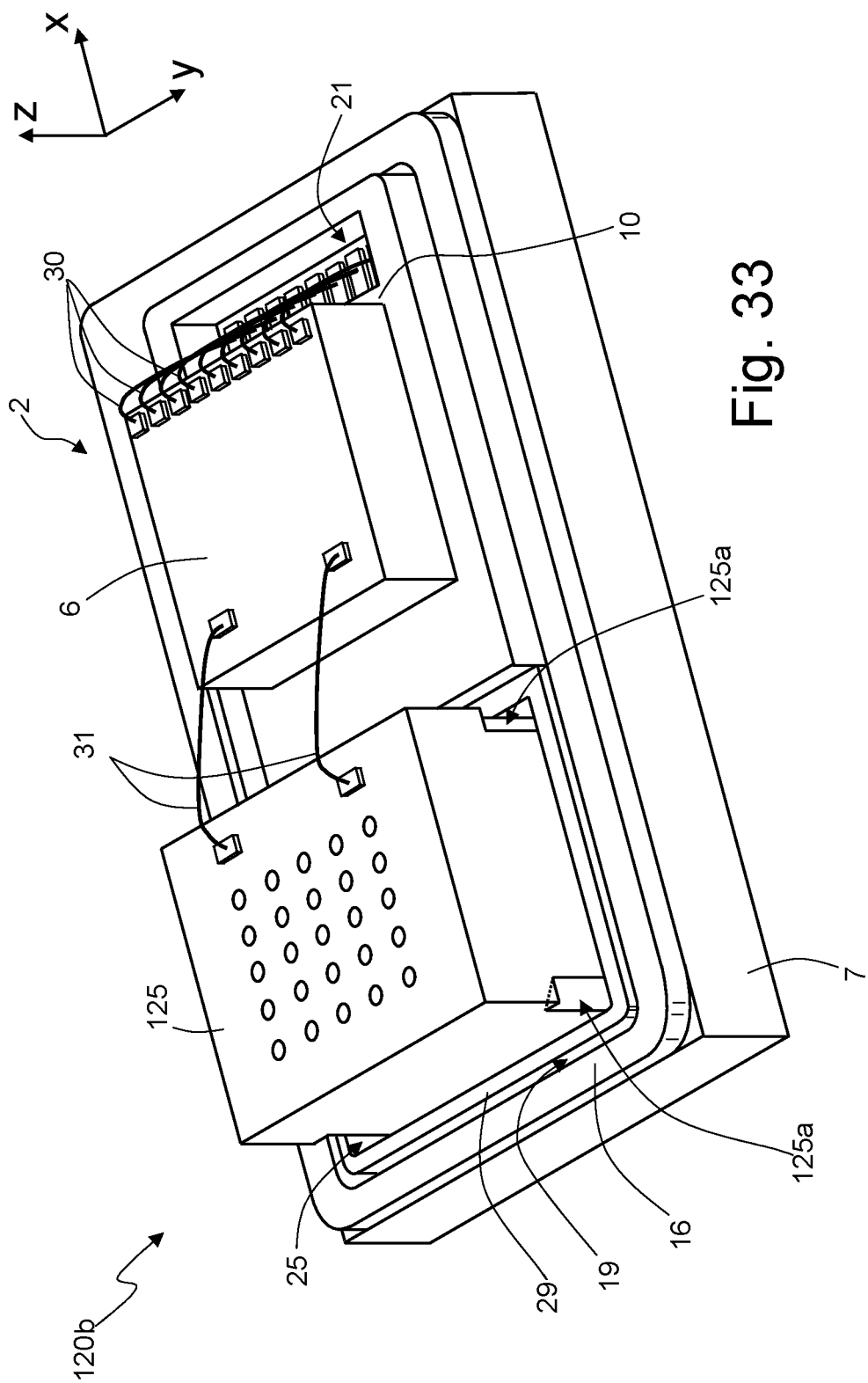

FIG. 33 shows a further embodiment of the present disclosure. In this case, a microelectromechanical microphone 120b has a sensor chip 125 in which only a portion 125a of the corners is chamfered, or cut, in particular a bottom portion that extends along Z starting from the substrate 2 (i.e., from the bottom face of the sensor chip 125) and does not reach the top face of the sensor chip 125. For instance, the cut is made for half the extension of the corners so that the bottom half has a chamfered, or generically cut, region 125a, and the top half does not present any difference with respect to the case of FIG. 30 (the top half is a sharp corner). Cutting, or chamfering, is carried out at the corners of the sensor chip 125. The characteristics of the partial cut are similar to those already described with reference to FIG. 32.

Figure 34:
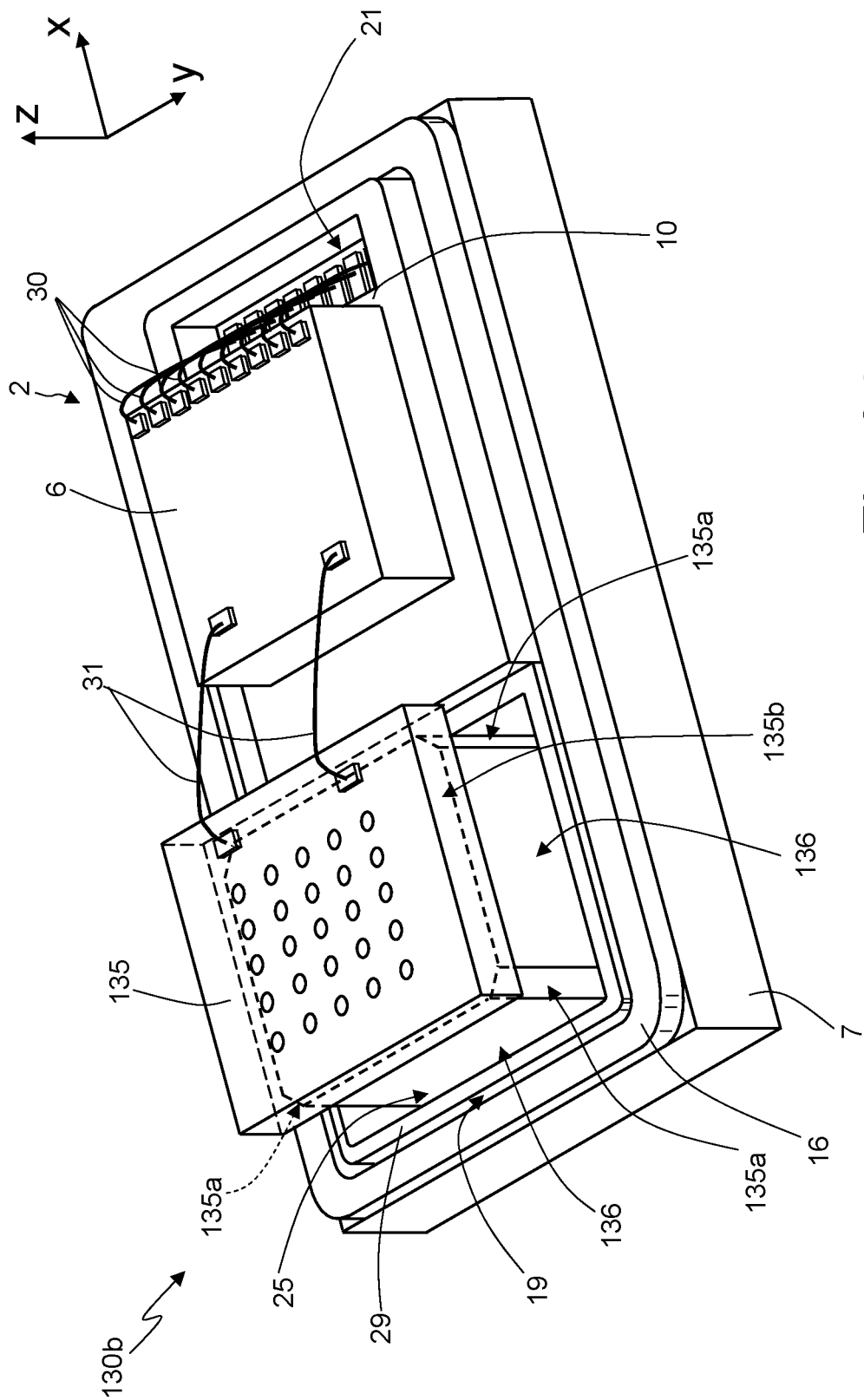

FIG. 34 shows a further embodiment of the present disclosure. In this case, a microelectromechanical microphone 130b has a sensor chip 135 in which only a portion of the edges 135a is chamfered, or cut, in particular a bottom portion, as in the case of FIG. 34. However, in this embodiment, the sensor chip 135 is further machined for removing perimetral portions of the sensor chip 135 also on the lateral faces 135b, and not only on the corners 135a. There is thus formed a lateral etch 136 that extends along the entire perimeter of the sensor chip 135 starting from the bottom face, which is coupled to the substrate 2 of the sensor chip 135, but without reaching the top face of the sensor chip 135. In this way, the area of the bottom face of the sensor chip 135 is smaller than the area of the top face thereof. The sensor chip 135 is thus mushroom-shaped, where the top face of the sensor chip 135 has an area greater than that of the bottom face of the sensor chip 135. In particular, the area of the top face is 5%-25% greater than the area of the bottom face; more in particular, it is 15% greater than the area of the bottom face.

Chamfering of the entire perimeter of the sensor chip 135 is performed in the bottom half of the sensor chip 135, i.e., in the portion of the sensor chip 135 that is in contact with the substrate 2, in order not to reduce or damage the top portion of the chip 135 that houses the membrane. In this way, it is possible to use a sensor chip 135 having a wide sensitive area (membrane), but having a base for bonding with the substrate 2 of smaller size and in any case such as not to reduce the width of the trench 25 beyond a minimum value fixed in the design stage.

Figure 35:
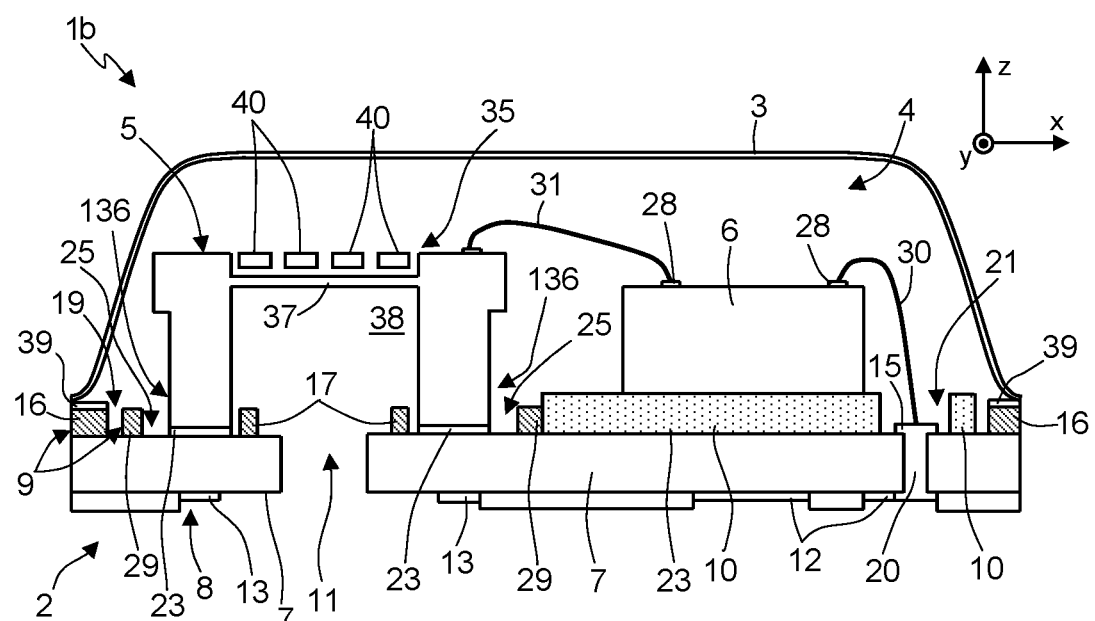
FIG. 35 is a lateral sectional view of the micro-electromechanical microphone of FIG. 34.

FIG. 35 is a lateral sectional view of the microelectromechanical microphone 130b of FIG. 34. As may be noted from FIG. 35, the lateral etch 136 of the sensor chip 135 extends, along Z, for a height greater than the thickness, once again along Z, of the barrier ring 29. In this way, the lateral portions of the sensor chip 135 outside the etch 136 may extend over the trench 25 (covering it at the top) and possibly also over the barrier ring 29, without affecting the capacity of the trench 25 to withhold adequately any glue that might come out of the bonding region 23.

Manufacture of the microelectromechanical microphone 1b of FIGS. 28-30, as of the microelectromechanical microphones 100b, 110b, 120b and 130b according to the respective embodiments, may be carried out in the way described hereinafter. Initially, the outer metal layer 8, the inner metal layer 9, and the solder mask 10 are defined with photolithographic processes to obtain the external contacts 12, the internal contacts 15, the bonding ring 16, the inner guard ring 17, and the barrier ring 29. Then, the bonding layer 23 is formed by dispensing glue between the inner guard ring 17 and the barrier ring 29, in the region in which it is desired to arrange the sensor chip 5. A bonding layer (not illustrated) is provided on the solder mask 10, in the region where it is desired to position the control chip 6. The latter is then bonded to the solder mask 10 by the bonding layer. Also the sensor chip 5 is joined to the substrate 2 in the glue layer previously dispensed. Finally, the wire bondings 30 are provided between the control chip 6 and the internal electrodes 15, and the wire bondings 31 are provided between the control chip 6 and the sensor chip 5. The cap 3 is then joined to the bonding ring 16 of the substrate 2 to obtain the structure of FIG. 28 or of FIGS. 31-34, according to the respective embodiments. According to the embodiments of FIGS. 31-34, the sensor chip 5 is machined prior to the step of bonding with the substrate 2. As mentioned previously, it is possible to shape the sensor chip 5 by laser cutting or plasma cutting, or else by steps, in themselves known, of lithography and selective chemical etching.

Figure 36:
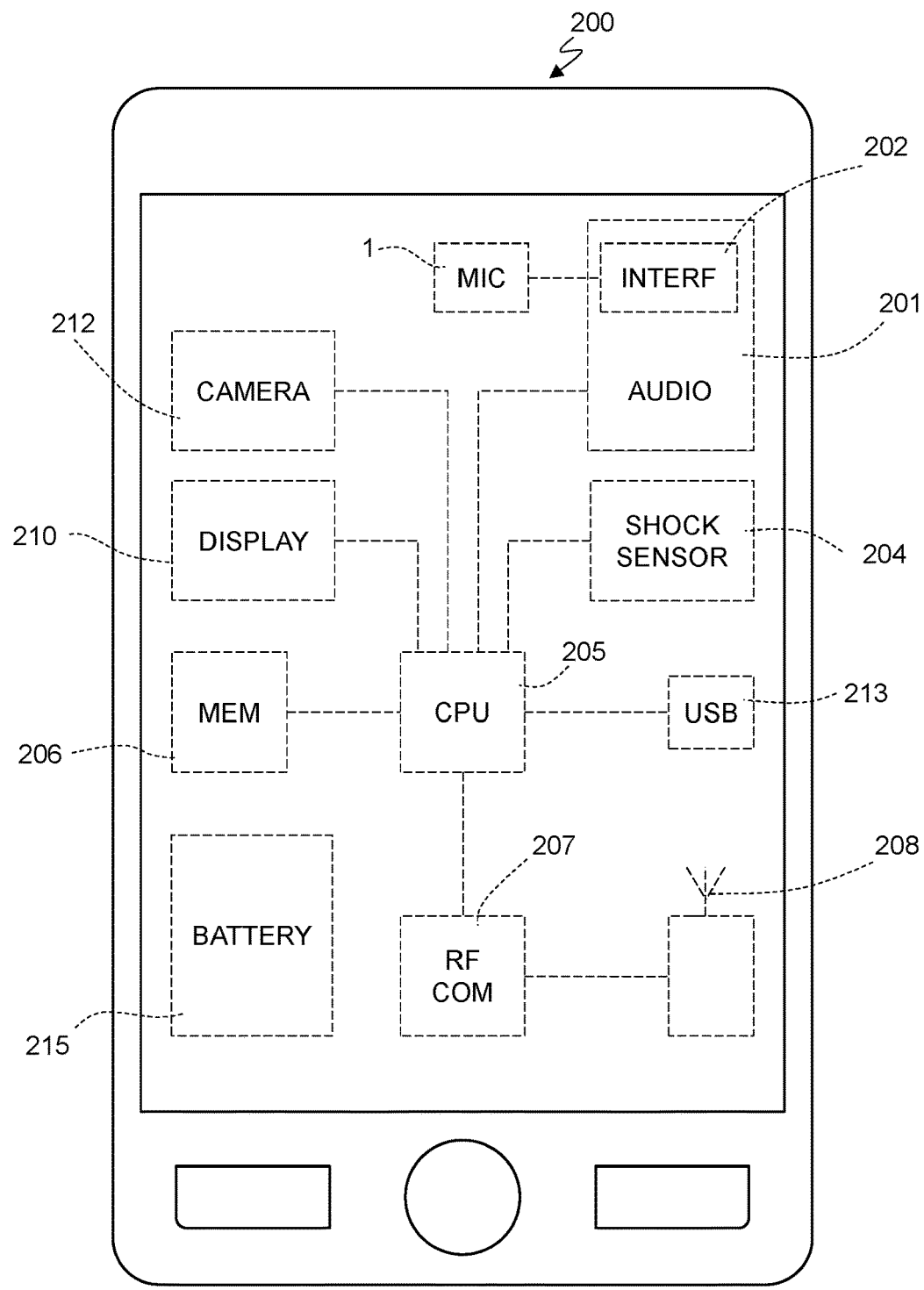
FIG. 36 is a simplified block diagram of an electronic system that incorporates a microelectromechanical microphone according to one embodiment of the present disclosure.

FIG. 36 illustrates an electronic system 200, which incorporates any of the microelectromechanical microphones described herein, such as microelectromechanical microphones 1, 1a, 1b, 100, 100a, and 100b, 110b, 120b, and 130b, but is shown and described with reference to microelectromechanical microphone 1.

The electronic system 200 may be an electronic device of any type, in particular a portable device supplied autonomously, such as, by way of non-limiting example, a cellphone, a portable computer, a video camera, a wearable device, such as a watch, a photographic camera, a multimedia reader, a portable apparatus for videogames, a motion-activated user interface for computers or consoles for videogames, a satellite-navigation device, etc. In the embodiment of FIG. 36, the electronic system 200 is a cellphone.

A microelectromechanical microphone 1, which may be any of the microelectromechanical microphones described herein, such as microelectromechanical microphone 1, 1a, 1b, 100, 100a, 100b, 110b, 120b, and 130b, and may be coupled to an acquisition interface 202 of an audio module 201. The electronic system 200 may further comprise a casing 203, rigidly coupled to which is an impact sensor 204, a control unit 205, a memory module 206, an RF communication module 207 coupled to an antenna 208, a display 210, a filming device 212, a serial-connection port 213, for example a USB port, and a battery 215 for autonomous supply.

The control unit 205 co-operates with the microelectromechanical microphone 1, for example exchanging signals through the audio module 201.

It should be noted that the scope of the present disclosure is not limited to embodiments having necessarily specifically one of the devices listed or all of them together.

The present applicant has found that, given the same dimensions, it is possible to obtain an improvement in the performance as compared to microelectromechanical microphones of a known type, or, alternatively, obtain the same performance as that of microelectromechanical microphones of a known type but in a smaller package. For instance, by shaping the sensor chip 5 as described and illustrated in FIGS. 31 to 35, it is possible to increase the sensitive area (i.e., the area of the sensor chip 5 containing the membrane) by approximately 25% with respect to known solutions, without increasing the overall dimensions of the electromechanical microphone thus obtained. Finally, it is evident that modifications and variations may be made to the microelectromechanical microphone described herein, without thereby departing from the scope of the present disclosure.

For instance, according to a variant that may be applied to some of the embodiments described, such as FIGS. 28-35, the barrier ring 29 is U-shaped and extends for surrounding the sensor chip on three sides, except for the side of the sensor chip directly facing the solder mask 10. A possible spreading of the glue of the bonding region 23 towards the solder mask 10 does not jeopardize the performance of the micro-electro-mechanical microphone. In this case, etching 136 of the embodiment of FIGS. 34 and 35 may extend to just three sides of the sensor chip 135 (i.e., the etch 136 is U-shaped), i.e., the etch 136 extends into the sides of the sensor chip 135 directly facing the U-shaped barrier, and does not directly face the solder mask 10 at the side of the sensor chip 135.

In various embodiments, sound port may be provided in the cap instead of in the substrate, which may thus be continuous in a region corresponding to the sensor chip. Similarly, it is possible to use substrates both of the LGA type and of the BGA type for electrical connection towards the outside.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A microelectromechanical microphone comprising:
   a substrate;
   a base coupled to the substrate;
   a sensor chip bonded to the substrate and integrating a microelectromechanical acoustic transducer; and
   a control chip bonded to the substrate and operatively coupled to the sensor chip, the sensor chip having a first portion that is overlying and bonded to the control chip, the sensor chip having a second portion that is overlying and bonded to the base, wherein the base has a first thickness and the control chip has a second thickness that is substantially the same thickness as the first thickness.

2. The microelectromechanical microphone according to claim 1, wherein the control chip has a first face, wherein the first portion of the sensor chip is bonded to the first face of the control chip, wherein the acoustic transducer includes a transduction member acoustically communicating with a sound port in the substrate.

3. The microelectromechanical microphone according to claim 1, comprising an adhesive layer that is partially on the base and partially on a first face of the control chip along a perimeter of the sensor chip, the sensor chip being bonded to the base and to the control chip through the adhesive layer.

4. The microelectromechanical microphone according to claim 1, wherein the base extends around a sound port.

5. The microelectromechanical microphone according to claim 1, wherein the substrate includes a core of a rigid dielectric material, and a metal layer on a face of the core, the sensor chip and the control chip being bonded to the metal layer.

6. The microphone according to claim 5, wherein the control chip is fixed to the core of the substrate and has a face substantially flush with an assembly surface of the base.

7. The microelectromechanical microphone according to claim 5, wherein:
   the metal layer of the substrate defines a supporting portion;
   a solder mask is fixed to the supporting portion; and
   the solder mask and the supporting portion of the metal layer form the base.

8. The microelectromechanical microphone according to claim 7, comprising a housing that houses the control chip, the housing being defined on one side by the core of the substrate.

9. The microelectromechanical microphone according to claim 8, wherein the housing is adjacent to the base.

10. The microelectromechanical microphone according to claim 5, wherein the base is arranged adjacent to a sound port and has a first thickness, the control chip having a second thickness that is substantially equal to the first thickness.

11. The microelectromechanical microphone according to claim 2, wherein the transduction member is centered around the sound port.

12. The microelectromechanical microphone according to claim 2, wherein the transduction member includes a membrane of semiconductor material over a cavity in a body of the sensor chip, the cavity being delimited on one side by the transduction member and being open on an opposite side.

13. A microelectromechanical microphone comprising:
   a supporting substrate having a first face, a second face, and a through opening extending from the first face to the second face;
   a sensor chip bonded to the first face of the supporting substrate and integrating a microelectromechanical electroacoustic transducer; and
   a control chip in the through opening of the supporting substrate and operatively coupled to the sensor chip, the sensor chip being at least partially arranged on top of and bonded to the control chip, wherein the control chip has a face that is coplanar with the second face of the supporting substrate.

14. The microelectromechanical microphone according to claim 13, comprising a fixing structure in the through opening and laterally surrounding the control chip, wherein the control chip is coupled to the supporting substrate by the fixing structure.

15. A microelectromechanical microphone comprising:
   a substrate having an inner surface and an outer surface;
   a sensor chip having a first face and second face, the first face of the sensor chip coupled to the inner surface of the substrate, the second face of the sensor chip integrating a MEMS electroacoustic transducer;
   a control chip coupled to the substrate and operatively coupled to the sensor chip;
   a bonding ring surrounding the sensor chip and the control chip;
   a cap coupled to the substrate by the bonding ring and forming an acoustic chamber with the substrate, the control chip and the sensor chip located in the acoustic chamber; and
   a barrier between the bonding ring and the sensor chip, the barrier being spaced from the bonding ring by a first distance and defining a first trench between the bonding ring and the barrier, the barrier being spaced from the sensor chip by a second distance and defining a second trench between the sensor chip and the barrier.

16. The microelectromechanical microphone according to claim 15, wherein the sensor chip is shaped to have one or more rounded corners or chamfered corners.

17. The microelectromechanical microphone according to claim 15, wherein the barrier has a height that is between 15 $\mu$m and 25 $\mu$m.

18. A microelectromechanical microphone comprising:
   a supporting substrate having a first face, a second face, and a through opening extending from the first face to the second face;
   a sensor chip bonded to the first face of the supporting substrate and integrating a microelectromechanical electroacoustic transducer; and
   a control chip in the through opening of the supporting substrate and operatively coupled to the sensor chip, the sensor chip being at least partially arranged on top of and bonded to the control chip, wherein the control chip has a recess, wherein an edge of the sensor chip is located in the recess of the control chip.

19. The microelectromechanical microphone according to claim 18, wherein the control chip has a first thickness and the supporting substrate has a second thickness, the second thickness being substantially equal to or greater than the first thickness.

20. A microelectromechanical microphone comprising:
   a supporting substrate having a first face, a second face, and a through opening extending from the first face to the second face;

a sensor chip bonded to the first face of the supporting substrate and integrating a microelectromechanical electroacoustic transducer; and a control chip in the through opening of the supporting substrate and operatively coupled to the sensor chip, the sensor chip being at least partially arranged on top of and bonded to the control chip, wherein the control chip has a first thickness and the supporting substrate has a second thickness, wherein the first thickness is equal to or greater than the second thickness.

21. The microelectromechanical microphone according to claim 20, wherein the control chip is coupled to the supporting substrate by a molding material.

22. The microelectromechanical microphone according to claim 20, wherein the sensor chip is arranged on top of and bonded to one side of the control chip.

23. The microelectromechanical microphone according to claim 20, wherein opposing surfaces of the control chip extend beyond the first and second faces of the supporting substrate.

* * * * *